US011634631B2

(12) United States Patent
Curley et al.

(10) Patent No.: US 11,634,631 B2
(45) Date of Patent: Apr. 25, 2023

(54) CADMIUM FREE REVERSE TYPE 1 NANOSTRUCTURES WITH IMPROVED BLUE LIGHT ABSORPTION FOR THIN FILM APPLICATIONS

(71) Applicant: Nanosys, Inc., Milpitas, CA (US)

(72) Inventors: John Curley, San Francisco, CA (US); Chunming Wang, Milpitas, CA (US); Jay Yamanaga, Campbell, CA (US); Xiaofeng Zhang, Pleasanton, CA (US); Christian Ippen, Cupertino, CA (US)

(73) Assignee: Nanosys, Inc., Milpitas, CA (US)

( * ) Notice: Subject to any disclaimer, the term of this patent is extended or adjusted under 35 U.S.C. 154(b) by 236 days.

(21) Appl. No.: 16/722,768

(22) Filed: Dec. 20, 2019

(65) Prior Publication Data
US 2020/0216756 A1 Jul. 9, 2020

Related U.S. Application Data

(60) Provisional application No. 62/784,218, filed on Dec. 21, 2018.

(51) Int. Cl.
*C09K 11/88* (2006.01)
*H01L 33/50* (2010.01)
(Continued)

(52) U.S. Cl.
CPC ........ *C09K 11/883* (2013.01); *C09K 11/0883* (2013.01); *G02F 1/1336* (2013.01); *H01L 27/323* (2013.01); *H01L 33/502* (2013.01); *B82Y 20/00* (2013.01); *B82Y 40/00* (2013.01); *G02F 1/133614* (2021.01)

(58) Field of Classification Search
CPC .............. C09K 11/883; C09K 11/0883; C09K 11/0811; C09K 11/574; G02F 1/1336; G02F 1/133614; G02F 1/133617; H01L 27/323; H01L 33/502; H01L 27/3232; H01L 51/502; H01L 51/0037; H01L 51/0039; H01L 51/0043; H01L 51/0077; H01L 51/0003; H01L 51/5056; H01L 51/5072; H01L 51/5088; H01L 51/5092; H01L 51/5096; H01L 51/5206; H01L 51/5221; H01L 51/56; H01L 2251/301; H01L 2251/303; H01L 2251/308;
(Continued)

(56) References Cited

U.S. PATENT DOCUMENTS 8,963,119 B2 2/2015 Jang et al.
2017/0306227 A1* 10/2017 Ippen ..................... C09K 11/70
(Continued)

OTHER PUBLICATIONS

Eychmuller, A., et al., "A quantum dot quantum well: CdS/HgS/CdS," *Chemical Physics Letters* 208(1-2):59-62, Elsevier, Netherlands (1993).
(Continued)

*Primary Examiner* — Jonathan Han
(74) *Attorney, Agent, or Firm* — Sterne, Kessler, Goldstein & Fox P.L.L.C.

(57) ABSTRACT

The invention relates to highly luminescent nanostructures with improved blue light absorbance, particularly core/shell nanostructures comprising a ZnSe core and InP and/or ZnS shell layers. The invention also relates to methods of producing such nanostructures.

20 Claims, 18 Drawing Sheets

(51) Int. Cl.
*H01L 27/32* (2006.01)
*C09K 11/08* (2006.01)
*B82Y 20/00* (2011.01)
*B82Y 40/00* (2011.01)
*G02F 1/13357* (2006.01)
*G02F 1/1335* (2006.01)

(58) Field of Classification Search
CPC ... H01L 2251/558; B82Y 20/00; B82Y 40/00; B82Y 30/00
USPC .......................... 977/774; 252/519.14, 519.4
See application file for complete search history.

(56) References Cited

U.S. PATENT DOCUMENTS

| | | | | |
|---|---|---|---|---|
| 2017/0352779 A1* | 12/2017 | Kuzumoto | ............... | C08K 9/08 |
| 2018/0151817 A1* | 5/2018 | Cho | ................... | H01L 51/0092 |
| 2018/0239245 A1* | 8/2018 | Yang | ..................... | G03F 7/0044 |
| 2018/0366674 A1* | 12/2018 | Sasaki | ...................... | C08K 9/04 |
| 2019/0018273 A1* | 1/2019 | Park | ........................ | C09B 57/00 |

OTHER PUBLICATIONS

Kim, S., et al., "Reverse Type-I ZnSe/InP/ZnS Core/Shell/Shell Nanocrystals: Cadmium-Free Quantum Dots for Visible Luminescence," *Small* 7(1):70-73, Wiley-VCH Verlag, Germany (2011).

Mews, A., et al., "Preparation, Characterization, and Photophysics of the Quantum Dot Quantum Well System CdS/HgS/CdS," *The Journal of Physical Chemistry* 98(3):934-941, American Chemical Society, United States (1994).

Schooss, A., et al., "Quantum-dot quantum well CdS/HgS/CdS: Theory and experiment," *Physical Review B* 49(24):934-941, American Physical Society, United States (1994).

Zhong, X., et al., "High-Quality Violet—to Red-Emitting ZnSe/CdSe Core/Shell Nanocrystals," *Chemistry of Materials* 17(16):4038-4042, American Chemical Society, United States (2005).

* cited by examiner

CADMIUM FREE REVERSE TYPE 1 NANOSTRUCTURES WITH IMPROVED BLUE LIGHT ABSORPTION FOR THIN FILM APPLICATIONS

BACKGROUND OF THE INVENTION

Field of the Invention

The invention relates to the field of nanotechnology. More particularly, the invention relates to highly luminescent nanostructures with improved blue light absorbance, particularly core/shell nanostructures comprising a ZnSe core and InP and/or ZnS shell layers. The invention also relates to methods of producing such nanostructures.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanostructures are of great interest for applications such as light emitting diodes (LEDs), lasers, and biomedical labeling. Highly luminescent nanostructures are particularly desirable for display applications.

The quantum dot color filter or quantum dot color converter (QDCC) is an emerging element in display architectures. The quantum dot performance in a QDCC can be measured by the photoluminescent emission maximum, the full width at half maximum (FWHM), the amount of blue light transmitted, and the photoconversion efficiency. Among these characteristics, the amount of blue light transmitted through the quantum dot layer is of particular importance. The amount of blue light transmittance directly impacts the color gamut, film down-conversion efficiency, and thickness of the display element. Moreover, if there is significant blue light leakage through green or red pixels, manufacturers will be forced to introduce additional filters into the display adding to the costs and reducing operational efficiency. As a result, it is important that the quantum dot film itself has extremely low blue light transmittance.

A need exists to prepare nanostructure compositions that have improved blue light absorbance and low blue light transmittance.

BRIEF SUMMARY OF THE INVENTION

The present invention provides a nanostructure comprising a core; a first shell disposed on the core, the first shell comprising a first semiconductor material comprising InP; and a second shell disposed on the first shell, the second layer comprising a second semiconductor material, wherein the band gap energy of the core is greater than the band gap energy of the first shell, and, wherein the optical density at 450 nm per total mass (OD450/total mass) of the nanostructure is between about 0.4 and about 0.9.

In some embodiments, the core comprises ZnSe.

In some embodiments, the diameter of the core is between about 2 nm and about 6 nm. In some embodiments, the diameter of the core is between about 3 nm and about 5 nm. In some embodiments, the diameter of the core is about 4 nm.

In some embodiments, the thickness of the first shell is between about 0.2 nm and about 4 nm. In some embodiments, the thickness of the first shell is between about 0.4 nm and about 2 nm. In some embodiments, the thickness of the first shell is about 0.5 nm.

In some embodiments, the first shell further comprises a Group III-V semiconductor material comprising InN, InSb, InAs, AlN, AlP, AlSb, AlAs, GaN, GaP, GaSb, GaAs, or a combination thereof.

In some embodiments, the thickness of the second shell is between about 0.2 nm and about 5 nm. In some embodiments, the thickness of the second shell is between about 0.8 nm and about 3 nm. In some embodiments, the thickness of the second shell is about 1 nm.

In some embodiments, the second shell comprises a Group II-VI semiconductor material comprising ZnS, ZnO, ZnSe, ZnTe, MgS, MgO, MgSe, MgTe, or a combination thereof. In some embodiments, the second shell comprises ZnSe, ZnS, or a combination thereof. In some embodiments, the second shell comprises ZnS.

In some embodiments, the $OD_{450}$/total mass of the nanostructure is between about 0.4 and about 0.7. In some embodiments, the $OD_{450}$/total mass of the nanostructure is about 0.7.

In some embodiments, the blue transmittance of the nanostructure when present in a film matrix is less than or equal to about 15%, wherein the film matrix has a thickness between about 1 μm and about 25 μm and comprises between about 10% and about 60% of the nanostructures by dry mass. In some embodiments, the blue transmittance of the nanostructure when present in a film matrix is between about 0% and about 12%, wherein the film matrix has a thickness between about 1 μm and about 25 μm and comprises between about 10% and about 60% of the nanostructures by dry mass. In some embodiments, the blue transmittance of the nanostructure when present in a film matrix is about 5%, wherein the film matrix has a thickness between about 1 μm and about 25 μm and comprises between about 10% and about 60% of the nanostructures by dry mass. In some embodiments, the blue transmittance of the nanostructure when present in a film matrix is about 1% or less, wherein the film matrix has a thickness between about 1 μm and about 25 μm and comprises between about 10% and about 60% of the nanostructures by dry mass. As used herein, the blue transmittance is defined as the fraction of an incident light transmitted through the film matrix, wherein the incident light has a wavelength of about 450 nm. In some embodiments, the film matrix a blue absorbance at 450 nm of less than 1% when not comprising the nanostructures. As used herein, the blue absorbance is defined as the fraction of an incident light absorbed by the film matrix, wherein the incident light has a wavelength of about 450 nm.

In some embodiments, the emission wavelength of the nanostructure is between about 500 nm and about 580 nm. In some embodiments, the emission wavelength of the nanostructure is between about 510 nm and about 550 nm. In some embodiments, the emission wavelength of the nanostructure is about 530 nm.

In some embodiments, the photoluminescence quantum yield of the nanostructure is between 30% and 99%. In some embodiments, the photoluminescence quantum yield of the nanostructure is between 40% and 60%.

In some embodiments, the nanostructure is a quantum dot.

In some embodiments, the nanostructure is free of cadmium.

The present invention also provides a device comprising the nanostructure according to any one of the embodiments described above.

In some embodiments, the device is a display device.

In some embodiments, the display device comprises a quantum dot color converter comprising a back plane; a display panel disposed on the back plane; and a quantum dot layer comprising the nanostructure. In some embodiments, the quantum dot layer is disposed on the display panel. In some embodiments, the quantum dot layer comprises a patterned quantum dot layer.

In some embodiments, the backplane comprises a blue LED, an LCD, an OLED, or a microLED.

In some embodiments, the display device does not comprise a blue light filter. In some embodiments, the blue light filter has a transmittance smaller than 15% for light with a wavelength below about 510 nm.

In some embodiments, the quantum dot layer has a thickness between about 1 µm and about 25 µm. In some embodiments, the quantum dot layer has a thickness between about 5 µm and about 25 µm. In some embodiments, the quantum dot layer has a thickness between about 10 µm and about 12 µm. In some embodiments, the quantum dot layer has a thickness between about 1 µm and about 10 µm.

The present invention also provides a method of making a ZnSe core nanostructure with a half width at half maximum (HWHM) of an emitted light of less than or equal to about 10 nm, comprising: (a) admixing a solution of a selenium source, a zinc source, and at least one ligand under a first temperature between about 260° C. and about 340° C.; (b) adjusting the first temperature of the admixture in (a) to a second temperature between about 260° C. and about 300° C.; and (c) infusing a solution comprising the selenium source and the zinc source into the admixture in (b) at an infusing rate between about 0.5 mL/min and about 3 mL/min; to provide the core nanostructure.

In some embodiments, the method further comprises reducing the first temperature of the admixture in (a) to a temperature between about 220° C. and about 260° C. prior to (b) adjusting the first temperature of the admixture in (a) to a second temperature between about 260° C. and about 300° C.

In some embodiments, the HWHM of an emitted light of the ZnSe core nanostructure is between about 6 nm and about 10 nm. In some embodiments, the HWHM of an emitted light of the ZnSe core nanostructure is between about 8 nm and about 9 nm. In some embodiments, the HWHM of an emitted light of the ZnSe core nanostructure is about 9 nm.

In some embodiments, the emission wavelength of the ZnSe core nanostructure is between about 400 nm and about 450 nm. In some embodiments, the emission wavelength of the ZnSe core nanostructure is between about 410 nm and about 430 nm.

In some embodiments, the absorbance of the ZnSe core nanostructure is between about 380 nm and about 420 nm. In some embodiments, the absorbance of the ZnSe core nanostructure is about 400 nm.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is trioctylphosphine selenide.

In some embodiments, the zinc source is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate. In some embodiments, the zinc source is diethylzinc.

In some embodiments, the at least one ligand is an alkylamine. In some embodiments, the at least one ligand is oleylamine.

In some embodiments, the selenium source is trioctylphosphine selenide, the zinc source is diethylzinc, and the at least one ligand is oleylamine.

In some embodiments, the first temperature is between about 280° C. and about 320° C. In some embodiments, the first temperature is about 300° C.

In some embodiments, the second temperature is between about 270° C. and about 290° C. In some embodiments, the second temperature is about 280° C.

In some embodiments, the infusing rate in (c) is between about 0.5 mL/min and about 1.5 mL/min. In some embodiments, the infusing rate in (c) is about 1 mL/min.

The present invention also provides a method of making a core/shell nanostructure, comprising: (a) providing a core comprising a ZnSe nanostructure with a HWHM of an emitted light of less than or equal to about 10 nm, and a first ligand; (b) admixing the core with a zinc carboxylate; and (c) admixing the admixture in (b) with an indium source and a phosphorus source; and (d) admixing the admixture in (c) with a zinc source and a sulfur source.

In some embodiments, the zinc carboxylate is selected from the group consisting of zinc acetate, zinc hexanoate, zinc octanoate, zinc laurate, zinc myristate, zinc palmitate, zinc stearate, zinc dithiocarbamate, or mixtures thereof. In some embodiments, the zinc carboxylate is zinc acetate.

In some embodiments, the indium source is selected from the group consisting of an indium halide, an indium phosphonate, an indium carboxylate, or mixtures thereof. In some embodiments, the indium source is selected from the group consisting of indium chloride, indium fluoride, indium bromide, indium iodide, indium hydroxide, indium cyanide, indium cyanate, or mixtures thereof. In some embodiments, the indium source is indium chloride.

In some embodiments, the phosphorus source is selected from the group consisting of (trialkylsilyl)$_3$phosphines, trialkyl phosphine oxides, tris (dimethylamino) phosphine, or mixtures thereof. In some embodiments, the phosphorus source is tris(trimethylsilyl)phosphine.

In some embodiments, the zinc source is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc acetate.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is dodecanethiol.

In some embodiments, the admixing in (b) is at a temperature between about 100° C. and about 200° C. In some embodiments, the admixing in (b) is at a temperature of about 150° C.

In some embodiments, the admixing in (c) is at a temperature between about 190° C. and about 220° C. In some embodiments, the admixing in (c) is at a temperature of about 205° C.

In some embodiments, the admixing in (d) is at a temperature between about 170° C. and about 250° C. In some embodiments, the admixing in (d) is at a temperature of about 220° C.

In some embodiments, the method further comprises increasing the temperature to between about 200° C. and about 250° C. after the admixing in (c). In some embodiments, the method further comprises increasing the temperature to about 220° C. after the admixing in (c).

In some embodiments, the method further comprises increasing the temperature to between about 280° C. and about 310° C. after the admixing in (d). In some embodiments, the method further comprises increasing the temperature to about 310° C. after the admixing in (d).

DETAILED DESCRIPTION OF THE INVENTION

Definitions

Figure 1:
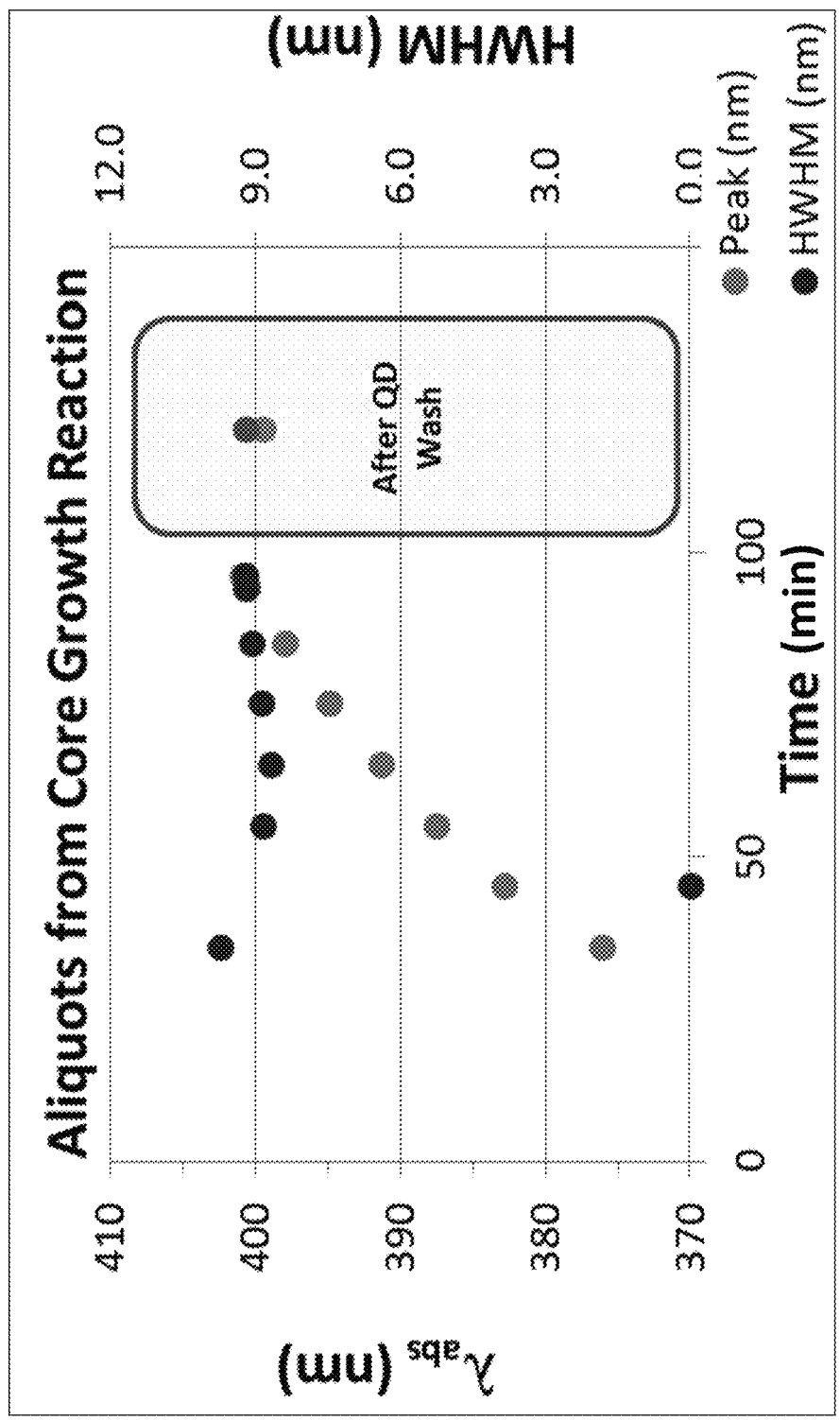
FIG. 1 shows a plot of UV-vis absorbance spectra and HWHM over time of aliquots from a ZnSe core growth reaction.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or +/−5% of the value, or +/−1% of the value so described. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

The term "reverse type 1 nanostructure" refers to a core/shell nanostructure, wherein the band gap energy of the core is greater than the band gap energy of the shell deposited directly onto the core (i.e., first shell).

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

"Peak emission wavelength" (PWL) is the wavelength where the radiometric emission spectrum of the light source reaches its maximum.

As used herein, the term "blue transmittance" refers to the fraction of incident light which is transmitted, i.e., passes through, a sample, wherein the incident light has a wavelength of about 450 nm.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from transmission electron microscopy (TEM) images of nanocrystals before and after a shell synthesis.

As used herein, the term "layer" refers to material deposited onto the core or onto previously deposited layers and that result from a single act of deposition of the core or shell material. The exact thickness of a layer is dependent on the material. For example, a ZnSe layer may have a thickness of about 0.33 nm and a ZnS layer may have a thickness of about 0.31 nm.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

As used herein, the term "half width at half-maximum" (HWHM) is a measure of the size distribution of quantum dots. The emission spectra of quantum dots generally have the shape of a Gaussian curve. The half width of the Gaussian curve is defined as the HWHM and gives an idea of the size distribution of the particles. A smaller HWHM corresponds to a narrower quantum dot nanocrystal size distribution. HWHM is also dependent upon the emission wavelength maximum.

As used herein, the term "external quantum efficiency" (EQE) is a ratio of the number of photons emitted from a light emitting diode (LED) to the number of electrons passing through the device. The EQE measures how efficiently a LED converts electrons to photons and allows them to escape. EQE can be measured using the formula:

EQE=[injection efficiency]×[solid-state quantum yield]×[extraction efficiency]

where:
injection efficiency=the proportion of electrons passing through the device that are injected into the active region;
solid-state quantum yield=the proportion of all electron-hole recombinations in the active region that are radiative and thus, produce photons; and
extraction efficiency=the proportion of photons generated in the active region that escape from the device.

Unless clearly indicated otherwise, ranges listed herein are inclusive.

A variety of additional terms are defined or otherwise characterized herein.

As discussed above, a need exists to prepare nanostructure compositions that have improved blue light absorbance and low blue light transmittance. One way to increase the amount of blue light absorbed by the green quantum dots is to increase the mass fraction of InP per quantum dot. This is impossible to do in a normal core/shell construction because increasing the InP core size will move the emission to longer wavelengths. However, it can be accomplished by using a reversed type 1 construction with ZnSe/InP/ZnS. By moving the InP layer, which dictates the emission wavelength, to an outer shell, the mass fraction of InP is increased on a per quantum dot basis (Table 1). The increased volume of InP will result in better blue light absorbance of the reversed type 1 quantum dots, solving a major hurdle to produce emitting materials for QDCCs and other blue-light down conversion displays that require low leakage of the blue light through the quantum dot-containing display element.

TABLE 1

Comparison of InP volumes for hypothetical type 1 and reversed type 1 quantum dot structures*

| Structure | Type 1 | Reverse Type 1 |
|---|---|---|
| Composition | InP/ZnSe/ZnS | ZnSe/InP/ZnS |
| Core Diameter | 1.7 | 4.5 |
| Shell 1 Thickness (nm) | 2.5 | 0.5 |
| Shell 2 Thickness | 1.5 | 1.0 |
| Total InP volume (nm³) | 2.7 | 17.7 |

*A reverse type 1 quantum dot may have a larger InP volume while maintaining green emission. The increased amount of InP in the quantum dot increases the amount of blue light absorbed per nanostructure.

Production of Nanostructures

Methods for colloidal synthesis of a variety of nanostructures are known in the art. Such methods include techniques for controlling nanostructure growth, e.g., to control the size and/or shape distribution of the resulting nanostructures.

In a typical colloidal synthesis, semiconductor nanostructures are produced by rapidly injecting precursors that undergo pyrolysis into a hot solution (e.g., hot solvent and/or surfactant). The precursors can be injected simultaneously or sequentially. The precursors rapidly react to form nuclei. Nanostructure growth occurs through monomer addition to the nuclei.

Surfactant molecules interact with the surface of the nanostructure. At the growth temperature, the surfactant molecules rapidly adsorb and desorb from the nanostructure surface, permitting the addition and/or removal of atoms from the nanostructure while suppressing aggregation of the growing nanostructures. In general, a surfactant that coordinates weakly to the nanostructure surface permits rapid growth of the nanostructure, while a surfactant that binds more strongly to the nanostructure surface results in slower nanostructure growth. The surfactant can also interact with one (or more) of the precursors to slow nanostructure growth.

Nanostructure growth in the presence of a single surfactant typically results in spherical nanostructures. Using a mixture of two or more surfactants, however, permits growth to be controlled such that non-spherical nanostructures can be produced, if, for example, the two (or more) surfactants adsorb differently to different crystallographic faces of the growing nanostructure.

A number of parameters are thus known to affect nanostructure growth and can be manipulated, independently or in combination, to control the size and/or shape distribution of the resulting nanostructures. These include, e.g., temperature (nucleation and/or growth), precursor composition, time-dependent precursor concentration, ratio of the precursors to each other, surfactant composition, number of surfactants, and ratio of surfactant(s) to each other and/or to the precursors.

Synthesis of Group II-VI nanostructures has been described, e.g., in U.S. Pat. Nos. 6,225,198, 6,322,901, 6,207,229, 6,607,829, 7,060,243, 7,374,824, 6,861,155, 7,125,605, 7,566,476, 8,158,193, and 8,101,234 and U.S. Patent Appl. Publication Nos. 2011/0262752 and 2011/0263062.

Although Group II-VI nanostructures such as CdSe/CdS/ZnS core/shell nanostructures can exhibit desirable luminescence behavior, as noted above, issues such as the toxicity of cadmium limit the applications for which such nanostructures can be used. Less toxic alternatives with favorable luminescence properties are thus highly desirable.

In some embodiments, the nanostructures are free from cadmium. As used herein, the term "free of cadmium" is intended that the nanostructures contain less than 100 ppm by weight of cadmium. The Restriction of Hazardous Substances (RoHS) compliance definition requires that there must be no more than 0.01% (100 ppm) by weight of cadmium in the raw homogeneous precursor materials. The cadmium level in the Cd-free nanostructures of the present invention is limited by the trace metal concentration in the precursor materials. The trace metal (including cadmium) concentration in the precursor materials for the Cd-free nanostructures, is measured by inductively coupled plasma mass spectroscopy (ICP-MS) analysis, and are on the parts per billion (ppb) level. In some embodiments, nanostructures that are "free of cadmium" contain less than about 50 ppm, less than about 20 ppm, less than about 10 ppm, or less than about 1 ppm of cadmium.

In some embodiments, the nanostructure comprises a ZnSe core and an InP shell. In some embodiments, the nanostructure comprises a ZnSe core, an InP shell, and a ZnS or ZnSeS shell. In some embodiments, the nanostructure is a ZnSe/InP core/shell nanostructure. In some embodiments, the nanostructure is a ZnSe/InP/ZnS core/shell/shell nanostructure. In some embodiments, the nanostructure is a ZnSe/InP/ZnSeS core/shell/shell nanostructure. In some embodiments, the ZnSe core is replaced with ZnS or alloyed to form ZnSeS or ZnMgSe.

Production of the ZnSe Core

As used herein, the term "nucleation phase" refers to the formation of a ZnSe core nucleus. As used herein, the term "growth phase" refers to the growth process of applying additional layers of ZnSe to the core nucleus.

In some embodiments, the ZnSe core comprises more than one layer of ZnSe. In some embodiments, the number of ZnSe layers in the ZnSe core is between 5 and 30, between 5 and 25, between 5 and 20, between 5 and 15, between 5 and 10, between 6 and 30, between 6 and 25, between 6 and 20, between 6 and 15, between 6 and 10, between 7 and 30, between 7 and 25, between 7 and 20, between 7 and 15, between 7 and 10, between 8 and 30, between 8 and 25, between 8 and 20, between 8 and 15, or between 8 and 10. In some embodiments, the number of ZnSe layers in the ZnSe core is between 7 and 20. In some embodiments, the number of ZnSe layers in the ZnSe core is between 10 and 15. In some embodiments, the ZnSe core comprises 13 layers of ZnSe.

The thickness of the ZnSe core layers can be controlled by varying the amount of precursor provided, reaction temperature, and duration of growth phase. For a given layer, at least one of the precursors is optionally provided in an amount whereby, when a growth reaction is substantially complete, a layer of a predetermined thickness is obtained. If more than one different precursor is provided, either the amount of each precursor can be so limited or one of the precursors can be provided in a limiting amount while the others are provided in excess.

The thickness of each ZnSe layer of the ZnSe core can be determined using techniques known to those of skill in the art. In some embodiments, the thickness of each layer is determined by comparing the diameter of the ZnSe core before and after the addition of each layer. In some embodiments, the diameter of the ZnSe core before and after the addition of each layer is determined by TEM. In some embodiments, each ZnSe layer has a thickness of between about 0.05 nm and about 2 nm, between about 0.05 nm and about 1 nm, between about 0.05 nm and about 0.5 nm, between about 0.05 nm and about 0.3 nm, between about 0.05 nm and about 0.1 nm, between about 0.1 nm and about 2 nm, between about 0.1 nm and about 1 nm, between about 0.1 nm and about 0.5 nm, between about 0.1 nm and about 0.3 nm, between about 0.3 nm and about 2 nm, between about 0.3 nm and about 1 nm, between about 0.3 nm and about 0.5 nm, between about 0.5 nm and about 2 nm, between about 0.05 nm and about 1 nm, or between about 1 nm and about 2 nm. In some embodiments, each ZnSe layer has an average thickness of about 0.3 nm.

In some embodiments, the present invention provides a method of making a ZnSe core nanostructure with a HWHM of an emitted light of less than or equal to about 10 nm, comprising:

(a) admixing a solution of a selenium source, a zinc source, and at least one ligand under a first temperature between about 260° C. and about 340° C.;

(b) adjusting the first temperature of the admixture in (a) to a second temperature between about 260° C. and about 300° C.; and (c) infusing a solution comprising the selenium source and the zinc source into the admixture in (b) at an infusing rate between about 0.5 mL/min and about 3 mL/min;

to provide the core nanostructure.

The size distribution of the ZnSe core nanostructures can be relatively narrow. In some embodiments, the HWHM of an emitted light of the ZnSe core nanostructure is between about 6 nm and about 10 nm, between about 6 nm and about 9 nm, between about 6 nm and about 8 nm, between about 6 nm and about 7 nm, between about 7 nm and about 10 nm, between about 7 nm and about 9 nm, between about 7 nm and about 8 nm, between about 8 nm and about 10 nm, or between about 8 nm and about 9 nm. In some embodiments, the HWHM of an emitted light of the ZnSe core nanostructure is about 9 nm.

In some embodiments, the zinc source is a dialkyl zinc compound. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, or zinc sulfate. In some embodiments, the zinc source is diethylzinc or dimethylzinc. In some embodiments, the zinc source is diethylzinc.

In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, cyclohexylphosphine selenide, octaselenol, dodecaselenol, selenophenol, elemental selenium, hydrogen selenide, bis(trimethylsilyl) selenide, and mixtures thereof. In some embodiments, the selenium source is trioctylphosphine selenide.

In some embodiments, the core layers are synthesized in the presence of at least one ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in US Patent Application Publication Nos. 2005/0205849, 2008/0105855, 2008/0118755, 2009/0065764, 2010/0140551, 2013/0345458, 2014/0151600, 2014/0264189, and 2014/0001405.

In some embodiments, ligands suitable for the synthesis of nanostructure cores, including ZnSe cores, are known by those of skill in the art. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide, trioctylphosphine, diphenylphosphine, triphenylphosphine oxide, and tributylphosphine oxide. In some embodiments, the ligand is an alkylamine. In some embodiments, the ligand is an amine selected from dodecylamine, oleylamine, hexadecylamine, and octadecylamine. In some embodiments, the ligand is trioctylphosphine. In some embodiments, the ligand is oleylamine. In some embodiments, the ligand is diphenylphosphine.

In some embodiments, the core is produced in the presence of a mixture of ligands. In some embodiments, the core is produced in the presence of a mixture comprising 2, 3, 4, 5, or 6 different ligands. In some embodiments, the core is produced in the presence of a mixture comprising 3 different ligands. In some embodiments, the mixture of ligands comprises oleylamine, trioctylphosphine, and diphenylphosphine.

In some embodiments, in an initial nucleation phase, a solution of a selenium source, a zinc source, and at least one ligand is admixed under a first temperature between about 260° C. and about 340° C., between about 260° C. and about 320° C., between about 260° C. and about 300° C., between about 280° C. and about 340° C., between about 280° C. and about 320° C., between about 280° C. and about 300° C., between about 300° C. and about 340° C., or between about 300° C. and about 320° C. In some embodiments, a solution of a selenium source, a zinc source, and at least one ligand is admixed under a first temperature of about 300° C.

In some embodiments, in a first growth phase, the admixed solution of a selenium source, a zinc source, and at least one ligand is maintained at an elevated temperature (e.g., 300° C.) for between about 2 minutes and about 10 minutes, between about 2 minutes and about 8 minutes, between about 2 minutes and about 5 minutes, between about 5 minutes and about 10 minutes, or between about 5 minutes and about 8 minutes. In some embodiments, the admixed solution of the selenium source, the zinc source, and the at least one ligand is maintained at an elevated temperature for about 5 minutes.

In some embodiments, after the first growth phase, the reaction mixture of a selenium source, a zinc source, and at least one ligand is reduced from the first temperature to a low quenching temperature to end the first growth phase. The low quenching temperature is between about 220° C. and about 260° C., between about 220° C. and about 250° C., between about 220° C. and about 240° C., between about 220° C. and about 230° C., between about 230° C. and about 260° C., between about 230° C. and about 250° C., between about 230° C. and about 240° C., between about 240° C. and about 260° C., between about 240° C. and about 250° C., or between about 250° C. and about 260° C. In some embodiments, the low quenching temperature is about 250° C.

In some embodiments, in a second growth phase, the temperature of the reaction mixture of a selenium source, a zinc source, and at least one ligand is adjusted to a second temperature between about 260° C. and about 300° C., between about 260° C. and about 290° C., between about 260° C. and about 280° C., between about 260° C. and about 270° C., between about 270° C. and about 300° C., between about 270° C. and about 290° C., between about 270° C. and about 280° C., between about 280° C. and about 300° C., between about 280° C. and about 290° C., or between about 290° C. and about 300° C. In some embodiments, the second temperature is about 280° C.

In some embodiments, the second growth phase comprises admixing the admixture after the first growth phase with a solution comprising the selenium source and the zinc source. Typically, additional precursor is provided after reaction of the previous layer is substantially complete (e.g., when at least one of the previous precursors is depleted or removed from the reaction or when no additional growth is detectable). The further additions of precursor create additional layers. In some embodiments, the additional solution comprising the selenium source and the zinc source is infused into the reaction at a rate of between about 0.5 mL/min and about 3 mL/min. In some embodiments, the additional solution comprising the selenium source and the zinc source is infused into the reaction at a rate of about 0.5 mL/min, about 1 mL/min, about 1.5 mL/min, about 2 mL/min, about 2.5 mL/min, or about 3 mL/min. In some embodiments, the additional solution comprising the selenium source and the zinc source is infused into the reaction at a rate of about 1 mL/min.

In some embodiments, the second growth phase comprises multiple growth periods. In some embodiments, each growth period comprises one addition period and one hold period. In each addition period, the additional solution is infused into the reaction admixture. In some embodiments, each addition period lasts between about 1 minute and about 10 minutes, between about 1 minute and about 8 minutes, between about 1 minute and about 5 minutes, between about 2 minutes and 10 minutes, between 2 minutes and 8 minutes, between about 2 minutes and 5 minutes, between about 4 minutes and about 10 minutes, between about 4 minutes and about 8 minutes, or between about 4 minutes and about 5 minutes. In some embodiments, each addition period lasts about 5 minutes. In the hold period, no additional solution is added. In some embodiments, each hold period lasts between about 1 minute and about 10 minutes, between about 1 minute and about 8 minutes, between about 1 minute and about 5 minutes, between about 2 minutes and 10 minutes, between 2 minutes and 8 minutes, between about 2 minutes and 5 minutes, between about 4 minutes and about 10 minutes, between about 4 minutes and about 8 minutes, or between about 4 minutes and about 5 minutes. In some embodiments, each hold period lasts about 5 minutes. In some embodiments, the second growth phase comprises 1, 2, 3, 4, 5, 6, 7, 8, 9, 10, 11, 12, 13, 14, 15, 16, 17, 19, 20 growth periods. In some embodiments the second growth phase comprises at least 20 growth periods. In some embodiments the second growth phase comprises enough growth periods until a desired size of nanostructures is reached.

After the ZnSe cores reach the desired thickness and diameter, the reaction mixture can be cooled to quench the reaction. In some embodiments, the ZnSe cores are cooled to room temperature. In some embodiments, an organic solvent is added to dilute the reaction mixture comprising the ZnSe cores.

In some embodiments, the organic solvent is trioctylphosphine, hexane, pentane, toluene, benzene, diethylether, acetone, ethyl acetate, dichloromethane (methylene chloride), chloroform, dimethylformamide, or N-methylpyrrolidinone. In some embodiments, the organic solvent is trioctylphosphine.

In some embodiments, the ZnSe cores are isolated. In some embodiments, the ZnSe cores are isolated by precipitation of the ZnSe cores from solvent. In some embodiments, the ZnSe cores are isolated by flocculation with ethanol.

The number of layers will determine the size of the ZnSe core. The size of the ZnSe cores can be determined using techniques known to those of skill in the art. In some embodiments, the size of the ZnSe cores is determined using TEM. In some embodiments, the diameter of the ZnSe core is between about 2 nm and about 6 nm, between about 2 nm and about 5 nm, between about 2 nm and about 4 nm, between about 2 nm and about 3 nm, between about 3 nm and about 6 nm, between about 3 nm and about 5 nm, or between about 3 nm and about 4 nm. In some embodiments, the diameter of the core is about 4 nm.

In some embodiments, the diameter of the ZnSe cores is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanostructures deviate substantially from those of bulk materials. A nanostructure behaves as if it were free when the confining dimension is large compared to the wavelength of the nanostructure. During this state, the band gap remains at its original energy due to a continuous energy state. However, as the confining dimension decreases and reaches a certain limit, typically in nanoscale, the energy spectrum becomes discrete. As a result, the band gap becomes size-dependent. This ultimately results in a blue shift in light emission as the size of the nanostructures decreases.

The concentration of the ZnSe cores is also determined in order to calculate the concentration of materials needed to provide a shell layer. The concentration of the ZnSe cores is determined using the absorption coefficient of bulk ZnSe at a low wavelength (e.g., 350 nm). The concentration can then be calculated using the following equation: Concentration (mg/mL)=((average optical density (at 350 nm))*(dilution factor))/(8.08), wherein, optical density describes the transmission of light through a highly blocking optical filter. Optical density is the negative of the logarithm of the transmission.

In some embodiments, the ZnSe cores of the nanostructures of the present invention have a ZnSe content (by weight) of between 40% to 90%, between 40% and 80%, between 40% and 70%, between 40% and 60%, between 40% and 50%, between 50% to 90%, between 50% and 80%, between 50% and 70%, between 50% and 60%, between 60% to 90%, between 60% and 80%, between 60% and 70%, between 70% to 90%, between 70% and 80%, or between 80% and 90%.

In some embodiments, the ZnSe core nanostructures display a high photoluminescence quantum yield. In some embodiments, the ZnSe core nanostructures display a photoluminescence quantum yield of between 20% to 90%, between 20% and 80%, between 20% and 70%, between 20% and 60%, between 20% and 50%, between 20% and 40%, between 20% and 30%, between 30% to 90%, between 30% and 80%, between 30% and 70%, between 30% and 60%, between 30% and 50%, between 30% and 40%, between 40% to 90%, between 40% and 80%, between 40% and 70%, between 40% and 60%, between 40% and 50%, between 50% to 90%, between 50% and 80%, between 50% and 70%, between 50% and 60%, between 60% to 90%, between 60% and 80%, between 60% and 70%, between 70% to 90%, between 70% and 80%, or between 80% and 90%.

In some embodiments, the ZnSe core nanostructures emit in the blue, indigo, violet, and/or ultraviolet range. In some embodiments, the photoluminescence spectrum for the ZnSe core nanostructures have a emission maximum between about 400 nm and about 450 nm, between about 400 nm and about 440 nm, between about 400 nm and about 430 nm, between about 400 nm and about 420 nm, between about 400 nm and about 410 nm, between about 410 nm and about 450 nm, between about 410 nm and about 440 nm, between about 410 nm and about 430 nm, between about 410 nm and about 420 nm, between about 420 nm and about 450 nm, between about 420 nm and about 440 nm, between about 420 nm and about 430 nm, between about 430 nm and about 450 nm, between about 430 nm and about 440 nm, or between about 440 nm and about 450 nm. In some embodiments, the photoluminescence spectrum for the ZnSe core nanostructures has an emission maximum of about 420 nm.

In some embodiments, the absorbance of the ZnSe core nanostructure is between about 380 nm and about 420 nm, between about 380 nm and about 410 nm, between about 380 nm and about 400 nm, between about 380 nm and about 390 nm, between about 390 nm and about 420 nm, between about 390 nm and about 410 nm, between about 390 nm and about 400 nm, between about 400 nm and about 420 nm, between about 400 nm and about 410 nm, or between about 410 nm and about 420 nm. In some embodiments, the absorbance of the ZnSe core nanostructure is about 400 nm.

Production of a Shell

In some embodiments, the nanostructures of the present invention include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material. In some embodiments, the nanostructures are a reverse type 1 nanostructure. And the at least one shell comprises a first shell disposed on the core, the first shell comprising a first semiconductor material; and a second shell disposed on the first shell, the second layer comprising a second semiconductor material, wherein the band gap energy of the core is greater than the band gap energy of the first shell.

In some embodiments, a first shell that comprises a group III-V semiconductor is deposited onto a core. In some embodiments, a group III-V semiconductor comprises a mixture of Group III and V elements. In some embodiments, suitable group III element comprises indium, aluminum, gallium, or a mixture thereof. In some embodiments, suitable group V element comprise phosphorus, nitrogen, antimony, arsenic, or a mixture thereof. In some embodiments, the shell deposited is a mixture of at least two of an indium source, a phosphorus source, a nitrogen source, an antimony source, and an arsenic source. In some embodiments, the shell deposited is a mixture of two of an indium source, a phosphorus source, a nitrogen source, an antimony source, and an arsenic source. In some embodiments, the shell deposited is a mixture of three of an indium source, a phosphorus source, a nitrogen source, an antimony source, and an arsenic source. In some embodiments, the first shell comprises a Group III-V semiconductor material comprising InN, InP, InSb, InAs, AlN, AlP, AlSb, AlAs, GaN, GaP, GaSb, GaAs, or a combination thereof. In some embodiments, the first shell comprises InP. In some embodiments, the Group III-V semiconductor optionally includes more than one Group III and/or Group V atom; for example, the nanostructures can comprise InGaP, InAlP, InGaN, GaAlN, or a combination thereof.

In some embodiments, a second shell that comprises a group II-VI semiconductor is deposited onto the first shell. In some embodiments, a group II-VI semiconductor comprises a mixture of Group II and VI elements. In some embodiments, the second shell deposited is obtained from a mixture of at least two of a zinc source, a selenium source, a sulfur source, a tellurium source, and a cadmium source. In some embodiments, the second shell deposited is obtained from a mixture of two of a zinc source, a selenium source, a sulfur source, a tellurium source, and a cadmium source. In some embodiments, the second shell deposited is obtained from a mixture of three of a zinc source, a selenium source, a sulfur source, a tellurium source, and a cadmium source. In some embodiments, the second shell comprises zinc and sulfur; zinc and selenium; zinc, sulfur, and selenium; zinc and tellurium; zinc, tellurium, and sulfur; zinc, tellurium, and selenium; zinc, cadmium, and sulfur; zinc, cadmium, and selenium; cadmium and sulfur; cadmium and selenium; cadmium, selenium, and sulfur; cadmium, zinc, and sulfur; cadmium, zinc, and selenium; or cadmium, zinc, sulfur, and selenium. In some embodiments, the second shell comprises a Group II-VI semiconductor material comprising ZnS, ZnO, ZnSe, ZnTe, MgS, MgO, MgSe, MgTe, or a combination thereof. In some embodiments, the second shell comprises ZnSe, ZnS, or a combination thereof.

In some embodiments, each shell comprises more than one monolayer of shell material. The number of monolayers is an average for all the nanostructures; therefore, the number of monolayers in a shell may be a fraction. In some embodiments, the number of monolayers in a first shell is between 0.25 and 15, between 0.25 and 10, between 0.25 and 8, between 0.25 and 6, between 0.25 and 4, between 0.25 and 2, between 2 and 15, between 2 and 10, between 2 and 8, between 2 and 6, between 2 and 4, between 6 and 15, between 6 and 10, between 6 and 8, between 8 and 15, or between 8 and 10. In some embodiments, the first shell comprises between 2 and 15 monolayers. In some embodiments, the number of monolayers in a second shell is between 0.25 and 20, between 0.25 and 15, between 0.25 and 10, between 0.25 and 8, between 0.25 and 6, between 0.25 and 4, between 0.25 and 2, between 2 and 20, between 2 and 15, between 2 and 10, between 2 and 8, between 2 and 6, between 2 and 4, between 6 and 20, between 6 and 15, between 6 and 10, between 6 and 8, between 8 and 20, between 8 and 15, or between 8 and 10. In some embodiments, the second shell comprises between 2 and 20 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by TEM.

In some embodiments, the thickness of the first shell is between about 0.2 nm and about 4 nm, between about 0.2 nm and about 3 nm, between about 0.2 nm and about 2 nm, between about 0.2 nm and about 1 nm, between about 0.2 nm and about 0.5 nm, between about 0.4 nm and about 4 nm, between about 0.4 nm and about 3 nm, between about 0.4 nm and about 2 nm, between about 0.4 nm and about 1 nm, between about 0.4 nm and about 0.5 nm, between about 0.6 nm and about 4 nm, between about 0.6 nm and about 3 nm, between about 0.6 nm and about 2 nm, between about 0.6 nm and about 1 nm, between about 0.8 nm and about 4 nm, between about 0.8 nm and about 3 nm, between about 0.8 nm and about 2 nm, or between about 0.8 nm and about 1 nm. In some embodiments, the thickness of the first shell is about 0.5 nm.

In some embodiments, the thickness of the second shell is between about 0.2 nm and about 5 nm, between about 0.2 nm and about 4 nm, between about 0.2 nm and about 3 nm, between about 0.2 nm and about 2 nm, between about 0.2 nm and about 1 nm, between about 0.2 nm and about 0.5 nm, between about 0.4 nm and about 5 nm, between about 0.4 nm and about 4 nm, between about 0.4 nm and about 3 nm, between about 0.4 nm and about 2 nm, between about 0.4 nm and about 1 nm, between about 0.4 nm and about 0.5 nm, between about 0.6 nm and about 5 nm, between about 0.6 nm and about 4 nm, between about 0.6 nm and about 3 nm, between about 0.6 nm and about 2 nm, between about 0.6 nm and about 1 nm, between about 0.8 nm and about 5 nm, between about 0.8 nm and about 4 nm, between about 0.8 nm and about 3 nm, between about 0.8 nm and about 2 nm, or between about 0.8 nm and about 1 nm. In some embodiments, the thickness of the second shell is about 1 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Appl. Publication No. 2008/0118755.

Ligands suitable for the synthesis of a shell are known by those of skill in the art. In some embodiments, the ligand is a fatty acid selected from the group consisting of lauric acid, caproic acid, caprylic acid, myristic acid, palmitic acid, stearic acid, and oleic acid. In some embodiments, the ligand is an organic phosphine or an organic phosphine oxide selected from trioctylphosphine oxide, trioctylphosphine, diphenylphosphine, triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is trioctylphosphine oxide, trioctylphosphine, or lauric acid.

In some embodiments, each shell is produced in the presence of a mixture of ligands. In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine oxide, trioctylphosphine, and lauric acid.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether.

In some embodiments, a core or a core/shell(s) and shell precursor are admixed at an temperature between about 20° C. and about 310° C., about 20° C. and about 280° C., about 20° C. and about 250° C., about 20° C. and about 200° C., about 20° C. and about 150° C., about 20° C. and about 100° C., about 20° C. and about 50° C., about 50° C. and about 310° C., about 50° C. and about 280° C., about 50° C. and about 250° C., about 50° C. and about 200° C., about 50° C. and about 150° C., about 50° C. and about 100° C., about 100° C. and about 310° C., about 100° C. and about 280° C., about 100° C. and about 250° C., about 100° C. and about 200° C., about 100° C. and about 150° C., about 150° C. and about 310° C., about 150° C. and about 280° C., about 150° C. and about 250° C., about 150° C. and about 200° C., about 200° C. and about 310° C., about 200° C. and about 280° C., about 200° C. and about 250° C., about 250° C. and about 310° C., about 250° C. and about 280° C., or about 280° C. and about 310° C. In some embodiments, a core or a core/shell(s) and shell precursor are admixed at a temperature between about 100° C. and about 200° C. In some embodiments, a core or a core/shell(s) and shell precursor are admixed at a temperature of about 150° C.

In some embodiments, after admixing a core or core/shell(s) and shell precursor, the temperature of the reaction mixture is increased to an elevated temperature between about 200° C. and about 310° C., about 200° C. and about 280° C., about 200° C. and about 250° C., about 200° C. and about 220° C., about 220° C. and about 310° C., about 220° C. and about 280° C., about 220° C. and about 250° C., about 250° C. and about 310° C., about 250° C. and about 280° C., or about 280° C. and about 310° C. In some embodiments, after contacting a core or core/shell(s) and shell precursor, the temperature of the reaction mixture is increased to between about 200° C. and about 250° C. In some embodiments, after contacting a core or core/shell(s) and shell precursor, the temperature of the reaction mixture is increased to about 220° C. In some embodiments, after contacting a core or core/shell(s) and shell precursor, the temperature of the reaction mixture is increased to between about 280° C. and about 310° C. In some embodiments, after contacting a core or core/shell(s) and shell precursor, the temperature of the reaction mixture is increased to about 310° C.

In some embodiments, after admixing a core or core/shell(s) and shell precursor, the time for the temperature to reach the elevated temperature is between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes.

In some embodiments, after admixing a core or core/shell(s) and shell precursor, the temperature of the reaction mixture is maintained at an elevated temperature for between about 2 minutes and about 240 minutes, about 2 minutes and about 200 minutes, about 2 minutes and about 100 minutes, about 2 minutes and about 60 minutes, about 2 minutes and about 40 minutes, about 5 minutes and about 240 minutes, about 5 minutes and about 200 minutes, about 5 minutes and about 100 minutes, about 5 minutes and about 60 minutes, about 5 minutes and about 40 minutes, about 10 minutes and about 240 minutes, about 10 minutes and about 200 minutes, about 10 minutes and about 100 minutes, about 10 minutes and about 60 minutes, about 10 minutes and about 40 minutes, about 40 minutes and about 240 minutes, about 40 minutes and about 200 minutes, about 40 minutes and about 100 minutes, about 40 minutes and about 60 minutes, about 60 minutes and about 240 minutes, about 60 minutes and about 200 minutes, about 60 minutes and about 100 minutes, about 100 minutes and about 240 minutes, about 100 minutes and about 200 minutes, or about 200 minutes and about 240 minutes. In some embodiments, after admixing a core or core/shell(s) and shell precursor, the temperature of the reaction mixture is maintained at an elevated temperature for between about 30 minutes and about 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures. The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between about 1 nm and about 15 nm, about 1 nm and about 10 nm, about 1 nm and about 9 nm, about 1 nm and about 8 nm, about 1 nm and about 7 nm, about 1 nm and about 6 nm, about 1 nm and about 5 nm, about 5 nm and about 15 nm, about 5 nm and about 10 nm, about 5 nm and about 9 nm, about 5 nm and about 8 nm, about 5 nm and about 7 nm, about 5 nm and about 6 nm, about 6 nm and about 15 nm, about 6 nm and about 10 nm, about 6 nm and about 9 nm, about 6 nm and about 8 nm, about 6 nm and about 7 nm, about 7 nm and about 15 nm, about 7 nm and about 10 nm, about 7 nm and about 9 nm, about 7 nm and about 8 nm, about 8 nm and about 15 nm, about 8 nm and about 10 nm, about 8 nm and about 9 nm, about 9 nm and about 15 nm, about 9 nm and about 10 nm, or about 10 nm and about 15 nm. In some embodiments, the core/shell(s) nanostructures have an average diameter of between about 6 nm and about 7 nm.

In some embodiments, the core/shell(s) nanostructure is subjected to an acid etching step before deposition of an additional shell.

Production of InP/ZnS Shells Over a ZnSe Core

In some embodiments, a method of making a ZnSe/InP/ZnS (core/shell/shell) nanostructure, comprising: (a) providing a core comprising a ZnSe nanostructure with a HWHM of an emitted light of less than or equal to about 10 nm, and a first ligand; (b) admixing the core with a zinc carboxylate; and (c) admixing the admixture in (b) with an indium source and a phosphorus source; and (d) admixing the admixture in (c) with a zinc source and a sulfur source.

In some embodiments, the ligand exchange process in (b) uses a zinc carboxylate, selected from the group consisting of zinc acetate, zinc hexanoate, zinc octanoate, zinc laurate, zinc myristate, zinc palmitate, zinc stearate, zinc dithiocarbamate, or mixtures thereof. In some embodiments, the zinc carboxylate is zinc acetate.

In some embodiments, the admixing in (b) is at a temperature between about 100° C. and about 200° C., between about 120° C. and about 200° C., between about 140° C. and about 200° C., between about 160° C. and about 200° C., between about 180° C. and about 200° C., between about 100° C. and about 180° C., between about 120° C. and about 180° C., between about 140° C. and about 180° C., between about 160° C. and about 180° C., between about 100° C. and about 160° C., between about 120° C. and about 160° C., between about 140° C. and about 160° C., between about 100° C. and about 140° C., between about 120° C. and about 140° C., or between about 100° C. and about 120° C. In some embodiments, the admixing in (b) is at a temperature of about 150° C.

In some embodiments, the admixing in (c) is at a temperature between about 190° C. and about 220° C., between about 200° C. and about 220° C., between about 210° C. and about 220° C., between about 190° C. and about 210° C., between about 200° C. and about 210° C., or between about 210° C. and about 220° C. In some embodiments, the admixing in (c) is at a temperature of about 205° C.

In some embodiments, the admixing in (d) is at a temperature between about 150° C. and about 250° C., between about 180° C. and about 250° C., between about 200° C. and about 250° C., between about 220° C. and about 250° C., between about 150° C. and about 220° C., between about 180° C. and about 220° C., between about 200° C. and about 220° C., between about 150° C. and about 200° C., or between about 180° C. and about 200° C. In some embodiments, the admixing in (d) is at a temperature of about 200° C.

Details of production of an InP shell and ZnS shell are discussed below.

Production of an InP Shell

In some embodiments, the first shell deposited onto the core nanostructure is an InP shell.

In some embodiments, the shell precursors contacted with a core or core/shell(s) nanostructure to prepare an InP shell comprise an indium source and a phosphorus source.

In some embodiments, the indium source is selected from the group consisting of an indium halide, an indium phosphonate, an indium carboxylate, or mixtures thereof. In some embodiments, the indium source is selected from the group consisting of indium chloride, indium fluoride, indium bromide, indium iodide, indium hydroxide, indium cyanide, indium cyanate, or mixtures thereof. In some embodiments, the indium source is indium chloride.

In some embodiments, the phosphorus source is a (trialkylsilyl)$_3$phosphine, trialkyl phosphine oxides, tris (dimethylamino) phosphine, or a mixture thereof. In some embodiments, the phosphorus source is (trimethylsilyl)$_3$phosphine, tributylphosphine, or a mixture thereof.

In some embodiments, the phosphorus source is (trialkylsilyl)$_3$phosphines, trialkyl phosphine oxides, tris (dimethylamino) phosphine, or mixtures thereof. In some embodiments, the phosphorus source is tris(trimethylsilyl) phosphine.

In some embodiments, the molar ratio of ZnSe in the core to indium source to prepare an InP shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the molar ratio of ZnSe in the core to phosphorus source to prepare an InP shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, an InP shell has a thickness between about 0.2 nm and about 4 nm, between about 0.2 nm and about 3 nm, between about 0.2 nm and about 2 nm, between about 0.2 nm and about 1 nm, between about 0.2 nm and about 0.5 nm, between about 0.4 nm and about 4 nm, between about 0.4 nm and about 3 nm, between about 0.4 nm and about 2 nm, between about 0.4 nm and about 1 nm, between about 0.4 nm and about 0.5 nm, between about 0.6 nm and about 4 nm, between about 0.6 nm and about 3 nm, between about 0.6 nm and about 2 nm, between about 0.6 nm and about 1 nm, between about 0.8 nm and about 4 nm, between about 0.8 nm and about 3 nm, between about 0.8 nm and about 2 nm, or between about 0.8 nm and about 1 nm. In some embodiments, an InP shell has a thickness of about 0.5 nm.

Production of a ZnS Shell Over an InP Shell

In some embodiments, the shell deposited onto the core or core/shell(s) nanostructure is a ZnS shell. In some embodiments, the ZnS shell is alloyed with Mg forming ZnMgS.

In some embodiments, the shell precursors contacted with a core or core/shell(s) nanostructure to prepare a ZnS shell comprise a zinc source and a sulfur source.

In some embodiments, the ZnS shell passivates defects at the nanostructure surface, which leads to an improvement in the quantum yield and to higher efficiencies when used in devices such as LEDs and lasers. Furthermore, spectral impurities which are caused by defect states may be eliminated by passivation, which increases the color saturation.

In some embodiments, the zinc source is selected from the group consisting of diethylzinc, dimethylzinc, diphenylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc acetate.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is dodecanethiol.

In some embodiments, the molar ratio of ZnSe in the core to zinc source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the molar ratio of ZnSe in the core to sulfur source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, a ZnS shell has a thickness between about 0.2 nm and about 5 nm, between about 0.2 nm and about 3 nm, between about 0.2 nm and about 2 nm, between about 0.2 nm and about 1 nm, between about 0.2 nm and about 0.5 nm, between about 0.4 nm and about 5 nm, between about 0.4 nm and about 3 nm, between about 0.4 nm and about 2 nm, between about 0.4 nm and about 1 nm, between about 0.4 nm and about 0.5 nm, between about 0.6 nm and about 5 nm, between about 0.6 nm and about 3 nm, between about 0.6 nm and about 2 nm, between about 0.6 nm and about 1 nm, between about 0.8 nm and about 5 nm, between about 0.8 nm and about 3 nm, between about 0.8 nm and about 2 nm, or between about 0.8 nm and about 1 nm. In some embodiments, a ZnS shell has a thickness of about 1 nm.

Core/Shell(s) Nanostructures

In some embodiments, the core/shell(s) nanostructure is a ZnSe/InP/ZnS core/shell/shell nanostructure. In some embodiments, the core/shell(s) nanostructure is a ZnSe/InP/ZnS core/shell/shell quantum dot. In some embodiments, the core/shell(s) nanostructure is a ZnSe/InP/ZnSeS core/shell/shell nanostructure. In some embodiments, the core/shell(s) nanostructure is a ZnSe/InP/ZnSeS core/shell/shell quantum dot.

In some embodiments, the core/shell(s) nanostructures display a high photoluminescence quantum yield. In some embodiments, the core/shell(s) nanostructures display a photoluminescence quantum yield of between 30% and 99%, 30% and 95%, 30% and 90%, 30% and 85%, 30% and 80%, 30% and 60%, 30% and 50%, 30% and 40%, 40% and 99%, 40% and 95%, 40% and 90%, 40% and 85%, 40% and 80%, 40% and 60%, 40% and 50%, 50% and 99%, 50% and 95%, 50% and 90%, 50% and 85%, 60% and 99%, 60% and 95%, 60% and 85%, 80% and 99%, 80% and 90%, 80% and 85%, 85% and 99%, or 85% and 95%. In some embodiments, the core/shell(s) nanostructures display a photoluminescence quantum yield of between 50% and 60%.

In some embodiments, the emission wavelength of the core/shell(s) nanostructure is between about 500 nm and about 580 nm, between about 510 nm and about 580 nm, between about 520 nm and about 580 nm, between about 530 nm and about 580 nm, between about 540 nm and about 580 nm, between about 550 nm and about 580 nm, between about 560 nm and about 580 nm, between about 570 nm and about 580 nm, between about 500 nm and about 570 nm, between about 510 nm and about 570 nm, between about 520 nm and about 570 nm, between about 530 nm and about 570 nm, between about 540 nm and about 570 nm, between about 550 nm and about 570 nm, between about 560 nm and about 570 nm, between about 500 nm and about 550 nm, between about 510 nm and about 550 nm, between about 520 nm and about 550 nm, between about 530 nm and about 550 nm, or between about 540 nm and about 550 nm. In some embodiments, the emission wavelength of the core/shell(s) nanostructure is between about 510 nm and about 550 nm. In some embodiments, the emission wavelength of the core/shell(s) nanostructure is about 530 nm.

The size distribution of the core/shell(s) nanostructures can be relatively narrow. In some embodiments, the photoluminescence spectrum of the population or core/shell(s) nanostructures can have a FWHM of between about 10 nm and about 60 nm, about 10 nm and about 40 nm, about 10 nm and about 30 nm, about 10 nm and about 20 nm, about 20 nm and about 60 nm, about 20 nm and about 40 nm, about 20 nm and about 30 nm, about 30 nm and about 60 nm, about 30 nm and about 40 nm, or about 40 nm and about 60 nm. In some embodiments, the photoluminescence spectrum of the population or core/shell(s) nanostructures can have a FWHM of between about 20 nm and about 30 nm.

The resulting core/shell(s) nanostructures are optionally embedded in a matrix (e.g., an organic polymer, silicon-containing polymer, inorganic, glassy, and/or other matrix) and present in a film matrix, used in production of a nanostructure phosphor, and/or incorporated into a device, e.g., an LED, backlight, downlight, or other display or lighting unit or an optical filter. Exemplary phosphors and lighting units can, e.g., generate a specific color light by incorporating a population of nanostructures with an emission maximum at or near the desired wavelength or a wide color gamut by incorporating two or more different populations of nanostructures having different emission maxima. A variety of suitable matrices are known in the art. See, e.g., U.S. Pat. No. 7,068,898 and U.S. Patent Appl. Publication Nos. 2010/0276638, 2007/0034833, and 2012/0113672. Exemplary nanostructure phosphor films, LEDs, backlighting units, etc. are described, e.g., in U.S. Patent Appl. Publications Nos. 2010/0276638, 2012/0113672, 2008/0237540, 2010/0110728, and 2010/0155749 and U.S. Pat. Nos. 7,374,807, 7,645,397, 6,501,091, and 6,803,719.

In some embodiments, the blue transmittance of the core/shell(s) nanostructure when present in a film matrix is less than or equal to about 15%, wherein the film matrix has a thickness between about 1 µm and about 25 µm and comprises between about 10% and about 60% of the core/shell(s) nanostructures by dry mass. In some embodiments, the blue transmittance of the nanostructure when present in a film matrix is between about 0% and about 15%, between about 0% and about 12%, between about 0% and about 10%, between about 0% and about 5%, between about 5% and about 15%, between about 5% and about 12%, between about 5% and about 10%, between about 10% and about 15%, between about 10% and about 12%, or between about 12% and about 15%, wherein the film matrix has a thickness between about 1 µm and about 25 µm and comprises between about 10% and about 60% of the core/shell(s) nanostructures by dry mass. In some embodiments, the blue transmittance of the nanostructure when present in a film matrix is about 5%, wherein the film matrix has a thickness between about 1 µm and about 25 µm and comprises between about 10% and about 60% of the core/shell(s) nanostructures by dry mass. In some embodiments, the film matrix has a blue transmittance of less than 1% when not comprising the nanostructure. As used herein, the blue transmittance is defined as the fraction of an incident light transmitted through the film matrix, wherein the incident light has a wavelength of about 450 nm The core/shell(s) nanostructures in the present invention has a strong absorbance at 450 nm where a blue LED centered at. The blue absorbance is measured as optical density at 450 nm per total mass ($OD_{450}$/total mass). In some embodiments, the $OD_{450}$/total mass of the nanostructure is between about 0.4 and about 0.9, between about 0.5 and about 0.9, between about 0.6 and about 0.9, between about 0.7 and about 0.9, between about 0.8 and about 0.9, between about 0.4 and about 0.8, between about 0.5 and about 0.8, between about 0.6 and about 0.8, between about 0.7 and about 0.8, between about 0.4 and about 0.7, between about 0.5 and about 0.7, between about 0.6 and about 0.7, between about 0.4 and about 0.6, between about 0.5 and about 0.6, or between about 0.4 and about 0.5. In some embodiments, the $OD_{450}$/total mass of the nanostructure is between about 0.4 and about 0.7. In some embodiments, the $OD_{450}$/total mass of the nanostructure is about 0.7.

Core/shell(s) nanostructures resulting from the methods are also a feature of the invention. Thus, one class of embodiments provides a population of core/shell(s) nanostructures. In some embodiments, the core/shell(s) nanostructures are quantum dots.

Nanostructure Layer

In some embodiments, the present disclosure provides a nanostructure layer comprising at least one population of nanostructures, wherein the nanostructure comprises a ZnSe core and at least one shell and $OD_{450}$/total mass of the nanostructure layer is between about 0.4 and about 0.9. In some embodiments, the at least one shell comprises InP and ZnS (or ZnSeS).

In some embodiments, the nanostructure is a quantum dot.

Molded Article

In some embodiments, the present disclosure provides a molded article comprising at least one population of nanostructures, wherein the nanostructure comprises a ZnSe core and at least one shell and $OD_{450}$/total mass of the nanostructure is between about 0.4 and about 0.9. In some embodiments, the at least one shell comprises InP and ZnS (or ZnSeS).

In some embodiments, the molded article is a film, a substrate for a display device, or a light emitting diode.

In some embodiments, the nanostructure is a quantum dot.

In some embodiments, the display device comprises a quantum dot color converter. In some embodiments, the display device comprises a back plane; a display panel disposed on the back plane; and a quantum dot layer comprising the nanostructure. In some embodiments, the quantum dot layer is disposed on the display panel. In some embodiments, the quantum dot layer comprises a patterned quantum dot layer.

In some embodiments, the backplane comprises a blue LED, an LCD, an OLED, or a microLED.

In some embodiments, the display device comprises a quantum dot color converter. In some embodiments, the display device comprises a quantum dot layer comprising the nanostructure, and a light source element selected from the group consisting of a blue LED, an OLED, a microLED, and a combination thereof. In some embodiments, the quantum dot layer is disposed on the light source element. In some embodiments, the quantum dot layer comprises a patterned quantum dot layer.

In some embodiments, the quantum dot layer has a thickness between about 1 µm and about 25 µm. In some embodiments, the quantum dot layer has a thickness between about 5 µm and about 25 µm. In some embodiments, the quantum dot layer has a thickness between about 10 µm and about 12 µm.

In some embodiments, the display device or the light emitting diode does not comprise a blue light filter. In some embodiments, the blue light filter has a transmittance smaller than 15%, 10%, or 5% for light with a wavelength below about 510 nm or below about 490 nm.

Making a Nanostructure Layer

In some embodiments, the nanostructure layer can be embedded in a polymeric matrix. As used herein, the term "embedded" is used to indicate that the nanostructure population is enclosed or encased with the polymer that makes up the majority of the components of the matrix. In some embodiments, at least one nanostructure population is suitably uniformly distributed throughout the matrix. In some embodiments, the at least one nanostructure population is distributed according to an application-specific distribution. In some embodiments, the nanostructures are mixed in a polymer and applied to the surface of a substrate.

In some embodiments, a nanostructure composition is deposited to form a nanostructure layer. In some embodiments, a nanostructure composition can be deposited by any suitable method known in the art, including but not limited to painting, spray coating, solvent spraying, wet coating, adhesive coating, spin coating, tape-coating, roll coating, flow coating, inkjet vapor jetting, drop casting, blade coating, mist deposition, or a combination thereof. The nanostructure composition can be coated directly onto the desired layer of a substrate. Alternatively, the nanostructure composition can be formed into a solid layer as an independent element and subsequently applied to the substrate. In some embodiments, the nanostructure composition can be deposited on one or more barrier layers.

In some embodiments, the nanostructure layer is cured after deposition. Suitable curing methods include photo-curing, such as UV curing, and thermal curing. Traditional laminate film processing methods, tape-coating methods, and/or roll-to-roll fabrication methods can be employed in forming a nanostructure layer.

Spin Coating

In some embodiments, the nanostructure composition is deposited onto a substrate using spin coating. In spin coating a small amount of material is typically deposited onto the center of a substrate loaded onto a machine called the spinner which is secured by a vacuum. A high speed of rotation is applied on the substrate through the spinner which causes centripetal force to spread the material from the center to the edge of the substrate. While most of the material is spun off, a certain amount remains of the substrate, forming a thin film of material on the surface as the rotation continues. The final thickness of the film is determined by the nature of the deposited material and the substrate in addition to the parameters chosen for the spin process such as spin speed, acceleration, and spin time. The spin coating condition required to achieve a controlled thickness is highly dependent upon the viscosity of the deposited material and the temperature. In some embodiments, a spin speed of 1500 rpm to 6000 rpm is used with a spin time of 10-60 seconds.

Mist Deposition

In some embodiments, the nanostructure composition is deposited onto a substrate using mist deposition. Mist deposition takes place at room temperature and atmospheric pressure and allows precise control over film thickness by changing the process conditions. During mist deposition, a liquid source material is turned into a very fine mist and carried to the deposition chamber by nitrogen gas. The mist is then drawn to a wafer surface by a high voltage potential between the field screen and the wafer holder. Once the droplets coalesce on the wafer surface, the wafer is removed from the chamber and thermally cured to allow the solvent to evaporate. The liquid precursor is a mixture of solvent and material to be deposited. It is carried to the atomizer by pressurized nitrogen gas. Price, S. C., et al., "Formation of Ultra-Thin Quantum Dot Films by Mist Deposition," ESC Transactions 11:89-94 (2007).

Spray Coating

In some embodiments, the nanostructure composition is deposited onto a substrate using spray coating. The typical equipment for spray coating comprises a spray nozzle, an atomizer, a precursor solution, and a carrier gas. In the spray deposition process, a precursor solution is pulverized into micro sized drops by means of a carrier gas or by atomization (e.g., ultrasonic, air blast, or electrostatic). The droplets that come out of the atomizer are accelerated by the substrate surface through the nozzle by help of the carrier gas which is controlled and regulated as desired. Relative motion between the spray nozzle and the substrate is defined by design for the purpose of full coverage on the substrate.

In some embodiments, application of the nanostructure composition further comprises a solvent. In some embodiments, the solvent for application of the nanostructure composition is water, organic solvents, inorganic solvents, halogenated organic solvents, or mixtures thereof. Illustrative solvents include, but are not limited to, water, D20, acetone, ethanol, dioxane, ethyl acetate, methyl ethyl ketone, isopropanol, anisole, γ-butyrolactone, dimethylformamide, N-methylpyrrolidinone, dimethylacetamide, hexamethylphosphoramide, toluene, dimethylsulfoxide, cyclopentanone, tetramethylene sulfoxide, xylene, ε-caprolactone, tetrahydrofuran, tetrachloroethylene, chloroform, chlorobenzene, dichloromethane, 1,2-dichloroethane, 1,1,2,2-tetrachloroethane, or mixtures thereof.

In some embodiments, the nanostructure compositions are thermally cured to form the nanostructure layer. In some embodiments, the compositions are cured using UV light. In some embodiments, the nanostructure composition is coated directly onto a barrier layer of a nanostructure film, and an additional barrier layer is subsequently deposited upon the nanostructure layer to create the nanostructure film. A support substrate can be employed beneath the barrier film for added strength, stability, and coating uniformity, and to prevent material inconsistency, air bubble formation, and wrinkling or folding of the barrier layer material or other materials. Additionally, one or more barrier layers are preferably deposited over a nanostructure layer to seal the material between the top and bottom barrier layers. Suitably, the barrier layers can be deposited as a laminate film and optionally sealed or further processed, followed by incorporation of the nanostructure film into the particular lighting device. The nanostructure composition deposition process can include additional or varied components, as will be understood by persons of ordinary skill in the art. Such embodiments will allow for in-line process adjustments of the nanostructure emission characteristics, such as brightness and color (e.g., to adjust the quantum dot film white point), as well as the nanostructure film thickness and other characteristics. Additionally, these embodiments will allow for periodic testing of the nanostructure film characteristics during production, as well as any necessary toggling to achieve precise nanostructure film characteristics. Such testing and adjustments can also be accomplished without changing the mechanical configuration of the processing line, as a computer program can be employed to electronically change the respective amounts of mixtures to be used in forming a nanostructure film.

Barrier Layers

In some embodiments, the molded article comprises one or more barrier layers disposed on either one or both sides of the nanostructure layer. Suitable barrier layers protect the nanostructure layer and the molded article from environmental conditions such as high temperatures, oxygen, and moisture. Suitable barrier materials include non-yellowing, transparent optical materials which are hydrophobic, chemically and mechanically compatible with the molded article, exhibit photo- and chemical-stability, and can withstand high temperatures. In some embodiments, the one or more barrier layers are index-matched to the molded article. In some embodiments, the matrix material of the molded article and the one or more adjacent barrier layers are index-matched to have similar refractive indices, such that most of the light transmitting through the barrier layer toward the molded article is transmitted from the barrier layer into the nanostructure layer. This index-matching reduces optical losses at the interface between the barrier and matrix materials.

The barrier layers are suitably solid materials, and can be a cured liquid, gel, or polymer. The barrier layers can comprise flexible or non-flexible materials, depending on the particular application. Barrier layers are preferably planar layers, and can include any suitable shape and surface area configuration, depending on the particular lighting application. In some embodiments, the one or more barrier layers will be compatible with laminate film processing techniques, whereby the nanostructure layer is disposed on at least a first barrier layer, and at least a second barrier layer is disposed on the nanostructure layer on a side opposite the nanostructure layer to form the molded article according to one embodiment. Suitable barrier materials include any suitable barrier materials known in the art. In some embodiments, suitable barrier materials include glasses, polymers, and oxides. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. Preferably, each barrier layer of the molded article comprises at least 2 layers comprising different materials or compositions, such that the multi-layered barrier eliminates or reduces pinhole defect alignment in the barrier layer, providing an effective barrier to oxygen and moisture penetration into the nanostructure layer. The nanostructure layer can include any suitable material or combination of materials and any suitable number of barrier layers on either or both sides of the nanostructure layer. The materials, thickness, and number of barrier layers will depend on the particular application, and will suitably be chosen to maximize barrier protection and brightness of the nanostructure layer while minimizing thickness of the molded article. In preferred embodiments, each barrier layer comprises a laminate film, preferably a dual laminate film, wherein the thickness of each barrier layer is sufficiently thick to eliminate wrinkling in roll-to-roll or laminate manufacturing processes. The number or thickness of the barriers may further depend on legal toxicity guidelines in embodiments where the nanostructures comprise heavy metals or other toxic materials, which guidelines may require more or thicker barrier layers. Additional considerations for the barriers include cost, availability, and mechanical strength.

In some embodiments, the nanostructure film comprises two or more barrier layers adjacent each side of the nanostructure layer, for example, two or three layers on each side or two barrier layers on each side of the nanostructure layer. In some embodiments, each barrier layer comprises a thin glass sheet, e.g., glass sheets having a thickness of about 100 µm, 100 µm or less, or 50 µm or less.

Each barrier layer of the molded article can have any suitable thickness, which will depend on the particular requirements and characteristics of the lighting device and application, as well as the individual film components such as the barrier layers and the nanostructure layer, as will be understood by persons of ordinary skill in the art. In some embodiments, each barrier layer can have a thickness of 50 µm or less, 40 µm or less, 30 µm or less, 25 µm or less, 20 µm or less, or 15 µm or less. In certain embodiments, the barrier layer comprises an oxide coating, which can comprise materials such as silicon oxide, titanium oxide, and aluminum oxide (e.g., Sift, $Si_2O_3$, $TiO_2$, or $Al_2O_3$). The oxide coating can have a thickness of about 10 µm or less, 5 µm or less, 1 µm or less, or 100 nm or less. In certain embodiments, the barrier comprises a thin oxide coating with a thickness of about 100 nm or less, 10 nm or less, 5 nm or less, or 3 nm or less. The top and/or bottom barrier can consist of the thin oxide coating, or may comprise the thin oxide coating and one or more additional material layers.

Nanostructure Layer Features and Embodiments

In some embodiments, the nanostructure layers are used to form display devices. As used herein, a display device refers to any system with a lighting display. Such devices include, but are not limited to, devices encompassing a liquid crystal display (LCD), an emissive display such as an OLED or microLED, televisions, computers, mobile phones, smart phones, personal digital assistants (PDAs), gaming devices, electronic reading devices, digital cameras, and the like.

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup. In some embodiments, the nanostructures are incorporated into display devices by "near-chip" placements. As used herein, "near-chip" refers to coating the top surface of the LED assembly with nanostructures such that the outgoing light passes through the nanostructure film.

Molded Articles with Improved Properties

In some embodiments, a molded article prepared using the nanostructures shows an EQE of between about 1.5% and about 20%, about 1.5% and about 15%, about 1.5% and about 12%, about 1.5% and about 10%, about 1.5% and about 8%, about 1.5% and about 4%, about 1.5% and about 3%, about 3% and about 20%, about 3% and about 15%, about 3% and about 12%, about 3% and about 10%, about 3% and about 8%, about 8% and about 20%, about 8% and about 15%, about 8% and about 12%, about 8% and about 10%, about 10% and about 20%, about 10% and about 15%, about 10% and about 12%, about 12% and about 20%, about 12% and about 15%, or about 15% and about 20%. In some embodiments, the nanostructure is a quantum dot. In some embodiments, the molded article is a light emitting diode.

In some embodiments, a molded article prepared using the nanostructures shows a photoluminescence spectrum with an emission maximum of between 500 nm and 580 nm. In some embodiments, a molded article prepared using the nanostructures shows a photoluminescence spectrum with an emission maximum of between 510 nm and 550 nm. In some embodiments, a molded article prepared using the nanostructures shows a photoluminescence spectrum with an emission maximum of about 530 nm.

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

EXAMPLES

Example 1

Synthesis of ZnSe(oleylamine)$_n$

The synthesis can be accomplished by a seed-growth method. Initially, a solution of diethyl zinc in dry and degassed trioctylphosphine (TOP) was rapidly injected into a mixture of TOPSe, diphenylphosphine (DPP), and oleylamine at 310° C. The mixture was maintained at 300° C. for 5 min, then quickly cooled below 260° C. to stop further growth or ripening. Then, the solution was ramped to 280° C., at which temperature a stock solution of diethyl zinc and TOPSe in TOP was infused into the reaction at a rate of 1 mL/min for 5 min over 10 min intervals. Growth nanostructures was monitored by UV-vis demonstrating that the redshift of the absorbance maxima was rapid for the first few additions of reagents and slowed with repeated additions. The slowing of the redshift allows accurate controlling of nanostructures' growth. The reaction was stopped at a desired absorbance wavelength (FIG. 1). Furthermore, the HWHM remained at ca. 9 nm over the course of the growth phase. After the desired absorbance wavelength was reached, the reaction was quenched by the addition of TOP. Then the ZnSe product was isolated by precipitation. This method is versatile and was used to obtain nanostructures with excitonic absorbances in the range of between about 380 nm and about 420 nm. In the example shown, the final absorbance was about 399.5 nm. In general, these ZnSe nanostructures have low $\Phi_{PL}$ between about 0 and about 15%, and have a broad tail on the right-hand side of the emission spectrum that is consistent with the presence of shallow surface trap states.

Example 2

Synthesis of ZnSe Cores with Amine Ligands

Reagents used for synthesizing ZnSe core is listed in Table 2.

TABLE 2

Reagents for ZnSe core growth in oleylamine.

| | | | Vol (mL) | mmol |
|---|---|---|---|---|
| Round-bottom | | | | |
| Oleylamine | | | 30.0 | 91.18 |
| Syringe 1 | | | | |
| TOPSe (1.92M) in TOP | | | 3.0 | 5.76 |
| DPP (50%) in TOP | | | 1.0 | 1.63 |
| TOP | | | 2.0 | |
| Syringe 2 | | | | |
| Diethyl Zinc (neat) | | | 0.6 | 5.83 |
| TOP | | | 5.0 | |
| Syringe 3 | | | | |
| Diethyl Zinc (neat) | | | 3.5 | 34.00 |
| TOPSe (1.92M) in TOP | | | 26.3 | 50.40 |
| TOP | | | 16.3 | |
| Volume loaded into Syringe 3 | Total Volume (mL) | 46.0 | Zn mmol Se mmol | 39.83 56.16 |
| Amount of Syringe 3 Added Based on UV-vis Reaction Monitoring | Total Volume (mL) | 45.0 | Zn mmol Se mmol | 38.9 54.9 |

Procedure:

An oven-dried 250 mL, three-neck, round-bottomed flask was equipped with a thermocouple adapter, a magnetic stir bar, a gas adapter, and a septum, and then placed under a dynamic vacuum. Oleylamine was then added to the flask. The oleylamine was heated to 100° C. under vacuum with gentle stirring for 1 hour.

The flask was backfilled with $N_2$ with a stirring rate increased to 800 rpm, which was maintained for the course for the reaction. The temperature controller was set to 310° C. to increase the temperature of the oleylamine from 100° C. to 310° C. gradually. And when the temperature reached 300° C., Syringe 1 was added to the flask. The temperature was then allowed to stabilize at 310° C. before Syringe 2 was added as rapidly as possible. The temperature set point was reduced to 300° C. and the resulting mixture was maintained above 300° C. for 5 min. Then the heating mantel was removed and compressed air was used to cool the flask below 260° C.

Figure 2:
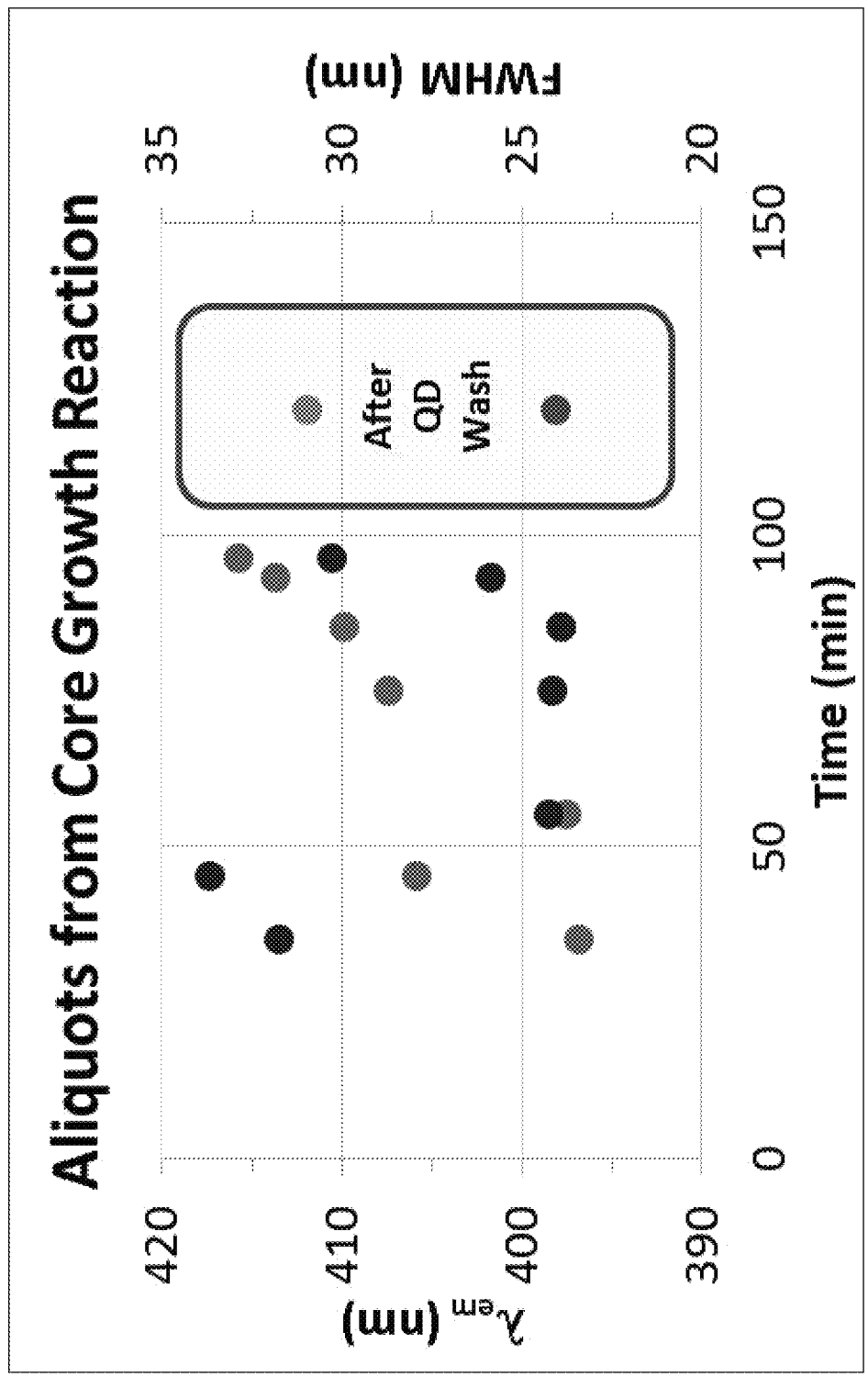
FIG. 2 shows a plot of photoluminescence emission spectra and full width at half maximum (FWHM) over time of aliquots from a ZnSe core growth reaction with excitation wavelength at 355 nm.

The heating mantle was returned to the flask and the temperature setting was set to 280° C. Syringe 3 was connected to a syringe pump and the needle was used to piece through the septum. The flask was allowed to equilibrate at 280° C. and had reached this temperature 10 min after the injection of Syringe 2. At this time, the addition of Syringe 3 was commenced by adding 5 mL of the mixture at a rate of 1 mL/min. The flask was allowed to stir for 5 min following the addition. Then, an additional 5 mL of Syringe 3 was added at 5 mL/min before another 5 min hold. In total, this process was repeated 9 times over 85 min. An aliquot was taken immediately following the addition to track the progress of the reaction as shown in FIGS. 1 and 2. FIGS. 1 and 2 show the total reaction time, with 0 min corresponding to the addition of Syringe 2. The addition of Syringe 3 begins at 10 min.

After the final portion of Syringe 3 was added, the reaction was allowed to stir for 3 min before the temperature quickly reduced by the addition of 20 mL TOP in Syringe 4. The heating mantle was removed and the mixture was allowed to cool. When the temperature fell below 150° C., 30 mL of toluene in Syringe 5, was added. The flask was allowed to cool to nearly room temperature before it was placed under vacuum and brought into an $N_2$-filled glovebox.

Figure 3:
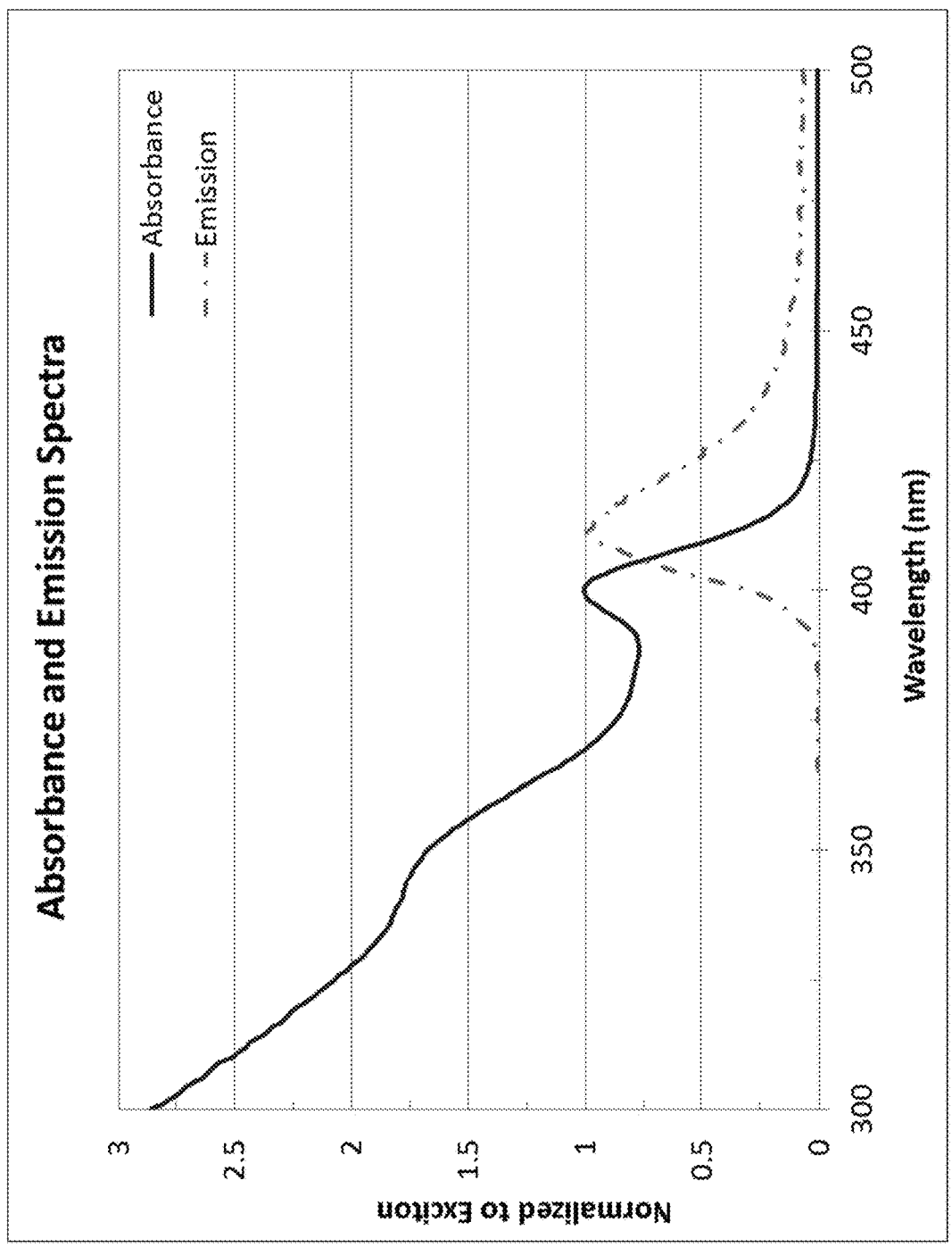
FIG. 3 shows UV-vis absorbance and photoluminescence emission spectra of isolated ZnSe cores with excitation wavelength at 355 nm.

Inside the glovebox, the mixture was dived among to PTFE bottles and 3-times the volume of ethanol was added to each bottle. The bottles were centrifuged at 4000 rpm for 10 min before the supernatant mostly decanted away from an oil and enough ethanol added to fill the bottle. The mixtures were again centrifuged for 10 min, the supernatant decanted, and the solid nanostructures product dissolved in a minimum of toluene. The toluene solution with dissolved nanostructures was then passed through a 0.45 mm filter. Roughly, 35 mL of solution or 5 g of ZnSe nanostructures were obtained. FIG. 3 shows an absorbance and photoluminescence emission spectra of the isolated ZnSe nanostructures.

Example 3

Ligand Exchange Method 1, Inducing a Shape Change

Figure 4:
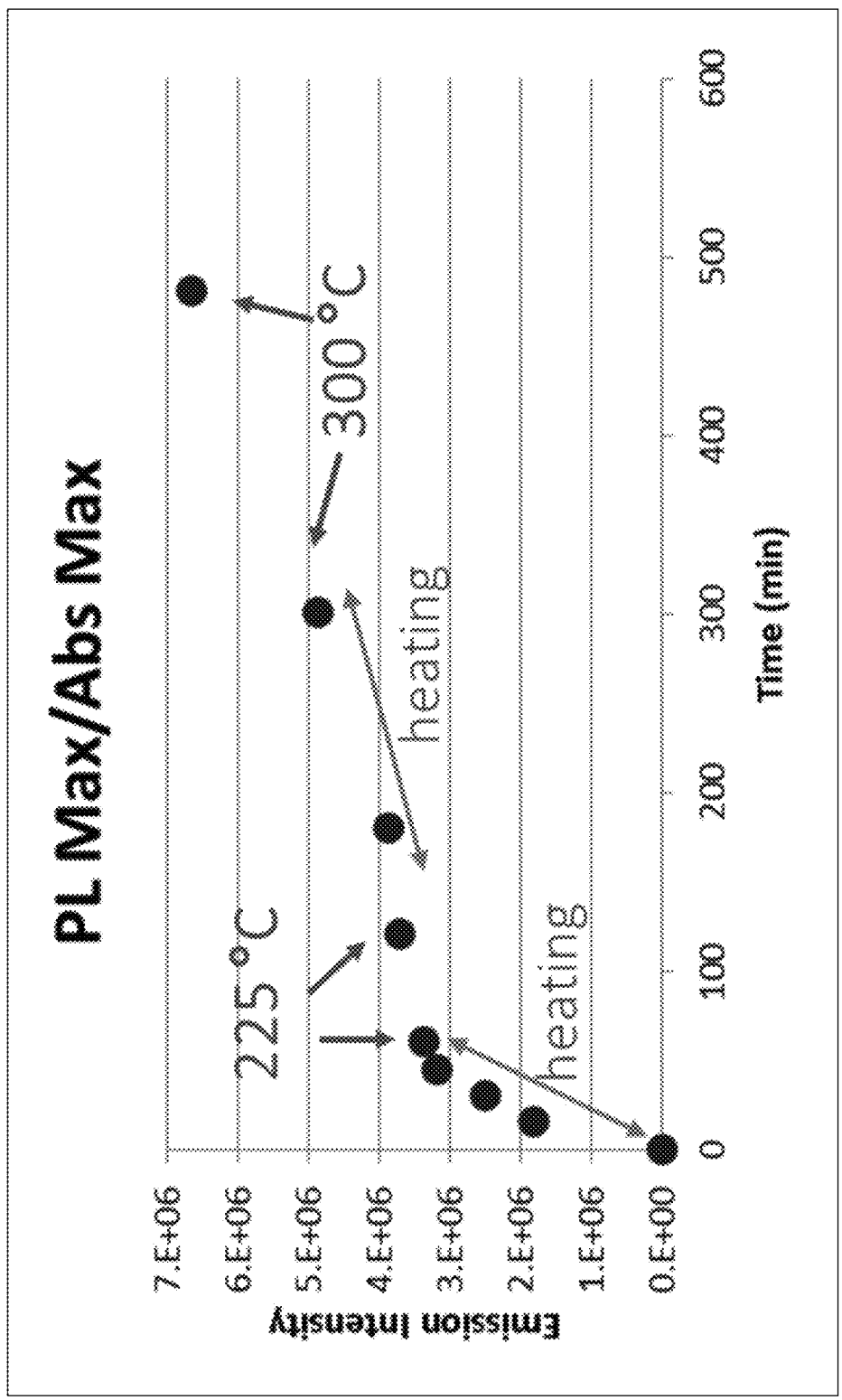
FIG. 4 shows a plot of photoluminescence emission intensity over time of aliquots from a ZnSe core during ligand exchange with $Zn(oleate)_2$ with excitation wavelength at 355 nm.
Figure 5B:
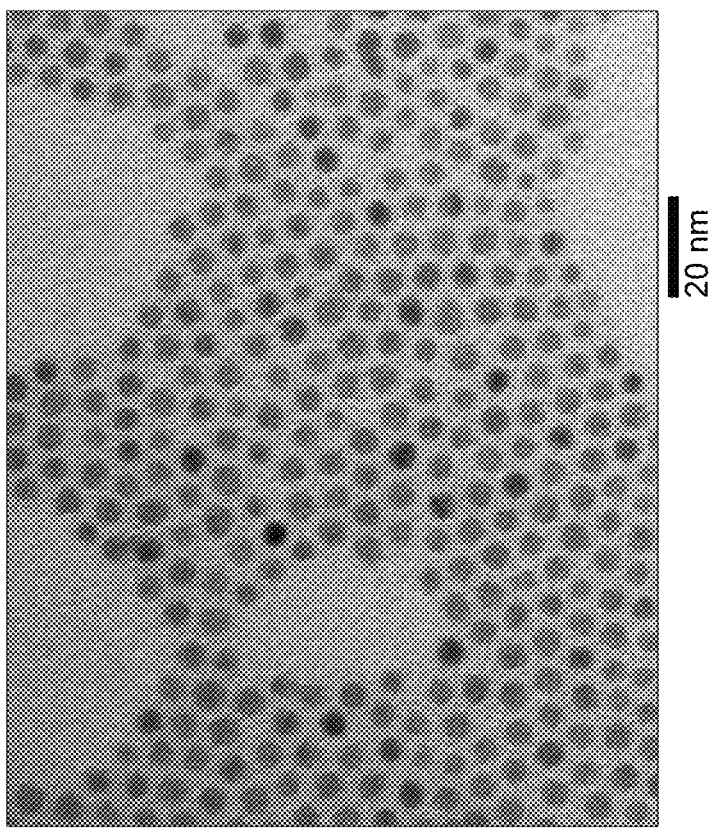
FIGS. 5A and 5B shows two transmission electron microscopy (TEM) images of the ZnSe cores: prepared in oleyl amine (FIG. 5A); and after ligand exchange with $Zn(oleate)_2$ (FIG. 5B).
Figure 5A:
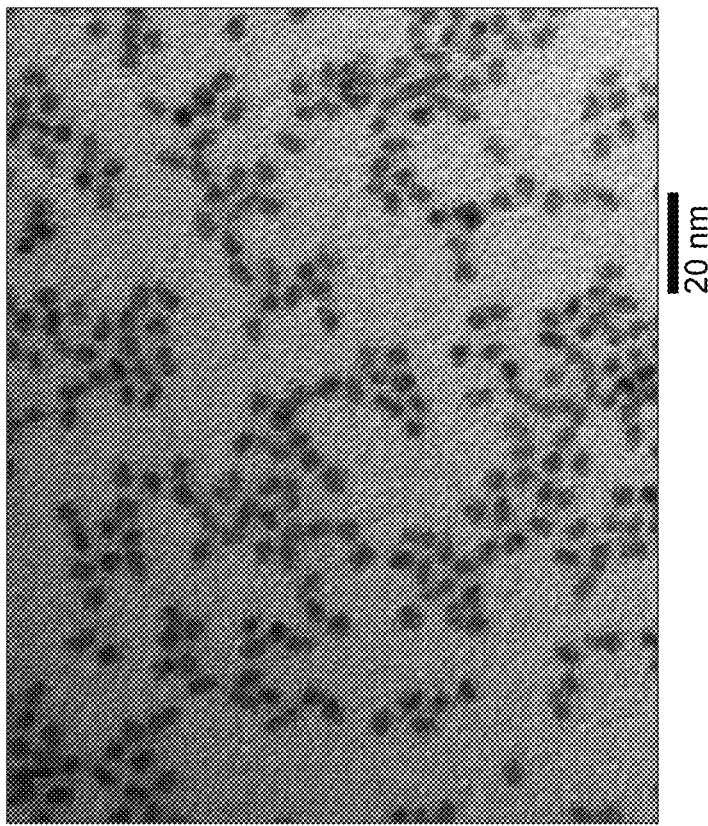

The treatment of ZnSe[oleylamine]n with an excess of Zn(oleate)$_2$ affected ligand exchange between the neutral amine donors on the surface and exogenous Lewis acid acceptor ligands. This reaction required that enough Zn(oleate)$_2$ to be added to both saturate the nanostructure surface and remove free amines from the solution. To facilitate this objective, the amount of Zn(oleate)$_2$ added was roughly 2.5-times greater than the amount of zinc in the initial ZnSe cores. Upon addition of the ZnSe[oleylamine]n to an excess of Zn(oleate)$_2$, the intensity of the emission increases (FIG. 4), and the emission line becomes more symmetrical as the number of surface trap states near the band edge is decreased. Further heating of this solution above 300° C. increases brightness, obtaining $\Phi_{PL}$>70%. Additionally, the emission is red-shifted with further heating and the nanostructures become rounder in shape (Table 3 and FIGS. 5A and 5B). This procedure produced nanostructures that have an emission in the range 410-435 nm depending on the length of time the sample was held at 310° C. In general, the emission line shape (FWHM) broadens as the emission red-shifts.

Figure 6B:
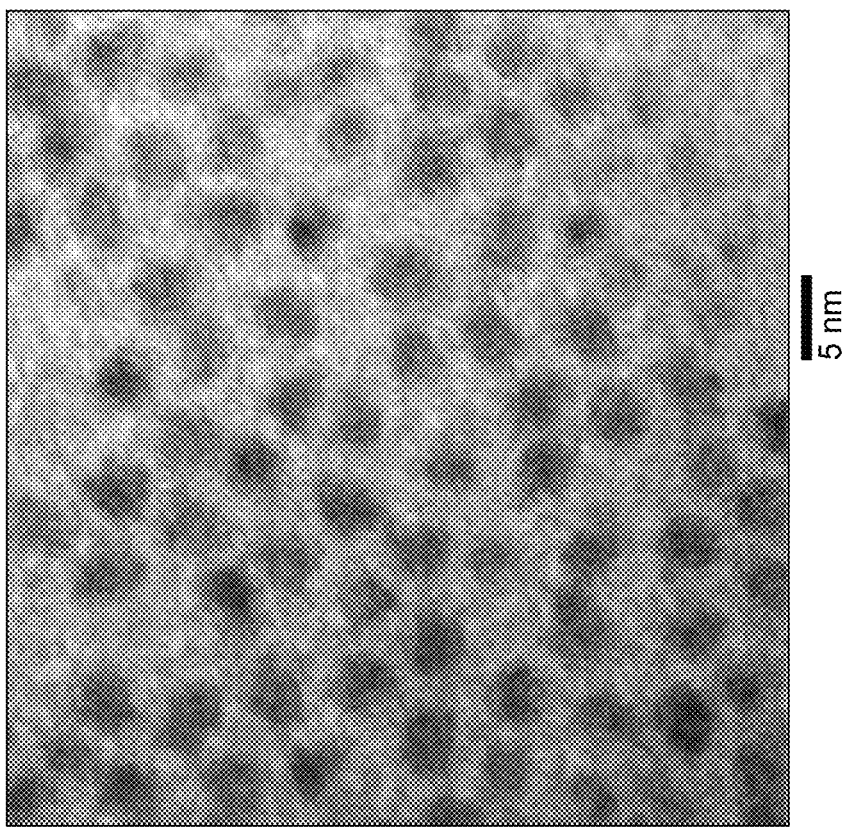
FIGS. 6A and 6B shows two TEM images of ZnSe cores following two different ligand exchange and InP treatments: ZnSe nanostructures (larger) and InP nanostructures (smaller) (FIG. 6A); and ZnSe/InP composite with no secondary nanostructures (FIG. 6B).
Figure 6A:
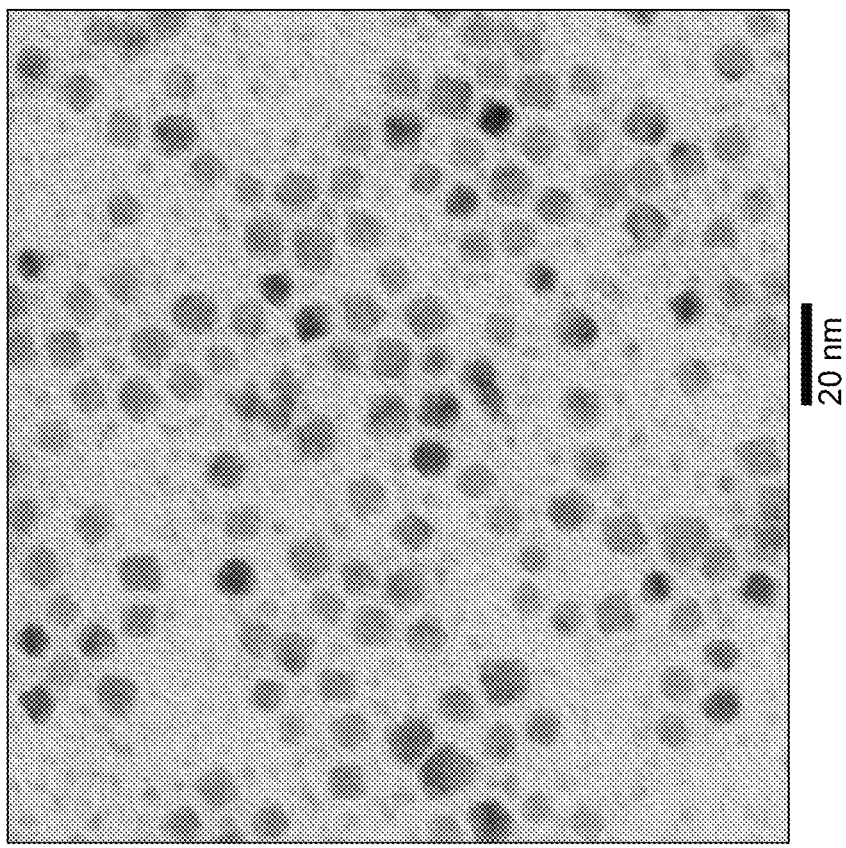

The so obtained, spherical ZnSe[Zn(oleate)$_2$]$_m$ nanostructures were treated with InP precursors under a variety of conditions. No conditions were found that allowed for InP growth over the ZnSe core by varying the nature of the precursor, addition rate, addition temperature, or amount of materials used. In all cases, homogenous nucleation and growth of InP nanostructures was instead observed (FIG. 6A).

TABLE 3

Data for ZnSe cores prior to and after ligand exchange with Zn(oleate)$_2$

| Sample | ZnSe Core Prepared in Oleyl Amine | Following Ligand Exchange with Zn(oleate)$_2$ |
|---|---|---|
| $\lambda_{abs}$ (nm) | 399.5 | 412 |
| HWHM (nm) | 9.7 | 10.4 |
| $\lambda_{em}$ (nm) | 412 | 423 |
| FWHM (nm) | 24.5 | 18.6 |
| $\Phi_{PL}$ | <5 | 74 |
| Size (nm) | 5.04 ± 0.66 | 5.35 ± 0.83 |

Example 4

Ligand Exchange with Zn(Oleate)$_2$ Concomitant with Shape Change

Reagents used for ligand exchange is listed in Table 4.

TABLE 4

Reagents for ligand exchange.

| ZnSe Ligand Exchange | Vol (mL) | mmol |
|---|---|---|
| Round-bottom | | |
| Zinc Oleate Syringe 1 | | 7.96 |
| ZnSe cores in toluene Syringe 2 | | 3.22 |
| TOP Syringe 3 | 5 | |
| toluene | 10 | |

Procedure:

A 100 mL, three-neck, round-bottomed flask was equipped with a thermocouple adapter, magnetic stir bar, gas adapter, and septum was added 5 g of Zn(oleate)$_2$. The flask was then attached to the vacuum line and placed under vacuum and heated to 80-95° C. where Zn(oleate)$_2$ melted. The flask was briefly returned to positive N$_2$ pressure and Syringe 1 and Syringe 2 were added into the flask. The mixture was then stored under vacuum until all of the toluene had been removed, using the vacuum line pressure gauge to determine the amount of toluene remaining.

Figure 7:
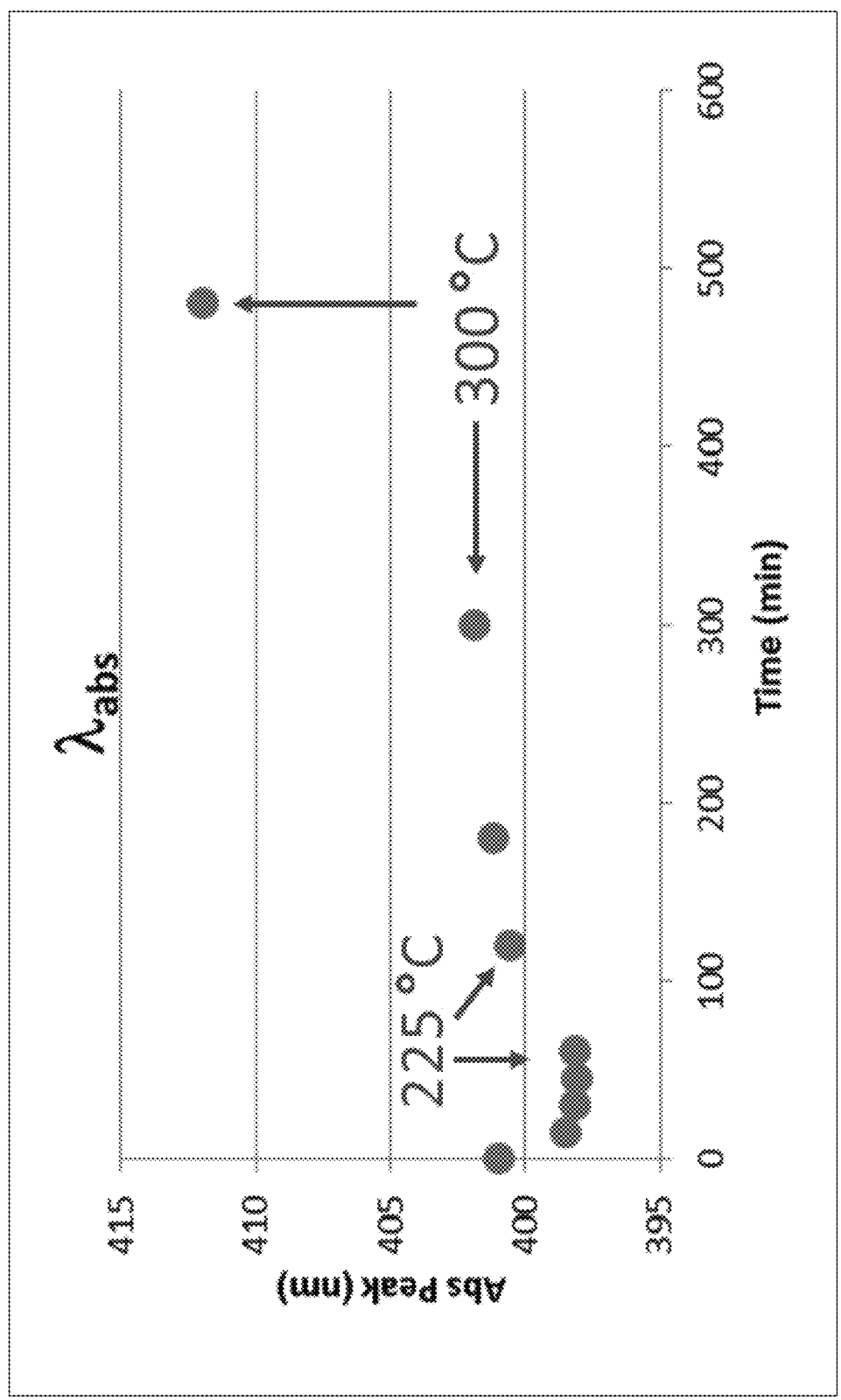
FIG. 7 shows a plot of changes in the UV-vis absorbance peak wavelength of the excitonic feature over time of aliquots from a ZnSe core during ligand exchange with $Zn(oleate)_2$.
Figure 8:
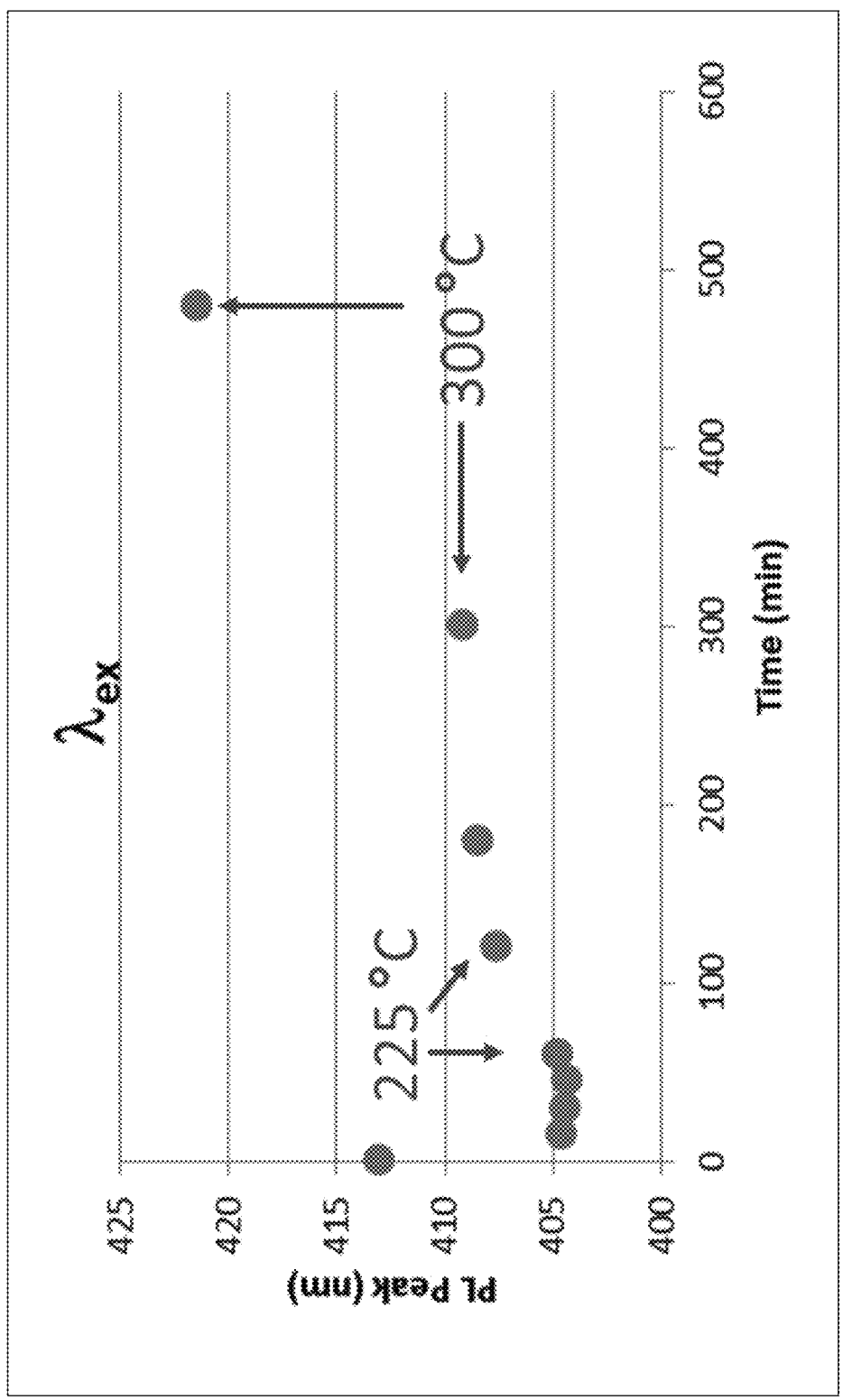
FIG. 8 shows a plot of photoluminescence emission spectra over time of aliquots from a ZnSe core during ligand exchange with $Zn(oleate)_2$ with excitation wavelength at 355 nm.

After the toluene removed, the flask was placed under positive N$_2$ pressure and ramped in 50° C. increments to 225° C. over 40 min. The mixture was stored at this temperature for approximately 2 hours before the flask heated in 50° C. increments to 300° C. over 2 hours. The flask was then maintained at 300° C. for 2 hours. During this time the ligand exchange process was monitored in three ways: UV-vis spectroscopy, FIG. 7; photoluminescent peak emission, FIG. 8; and photoluminescent intensity divided by the UV-vis excitation absorbance, FIG. 4. These metrics indicated that little broadening occurred, the band gap increased, and the emission intensity increased. A target emission of 420 nm was obtained based on the final emission wavelength of the same ZnSe cores after treatment with zinc acetate in 1-octadecene for 3 hours at 230° C.

Figure 9:
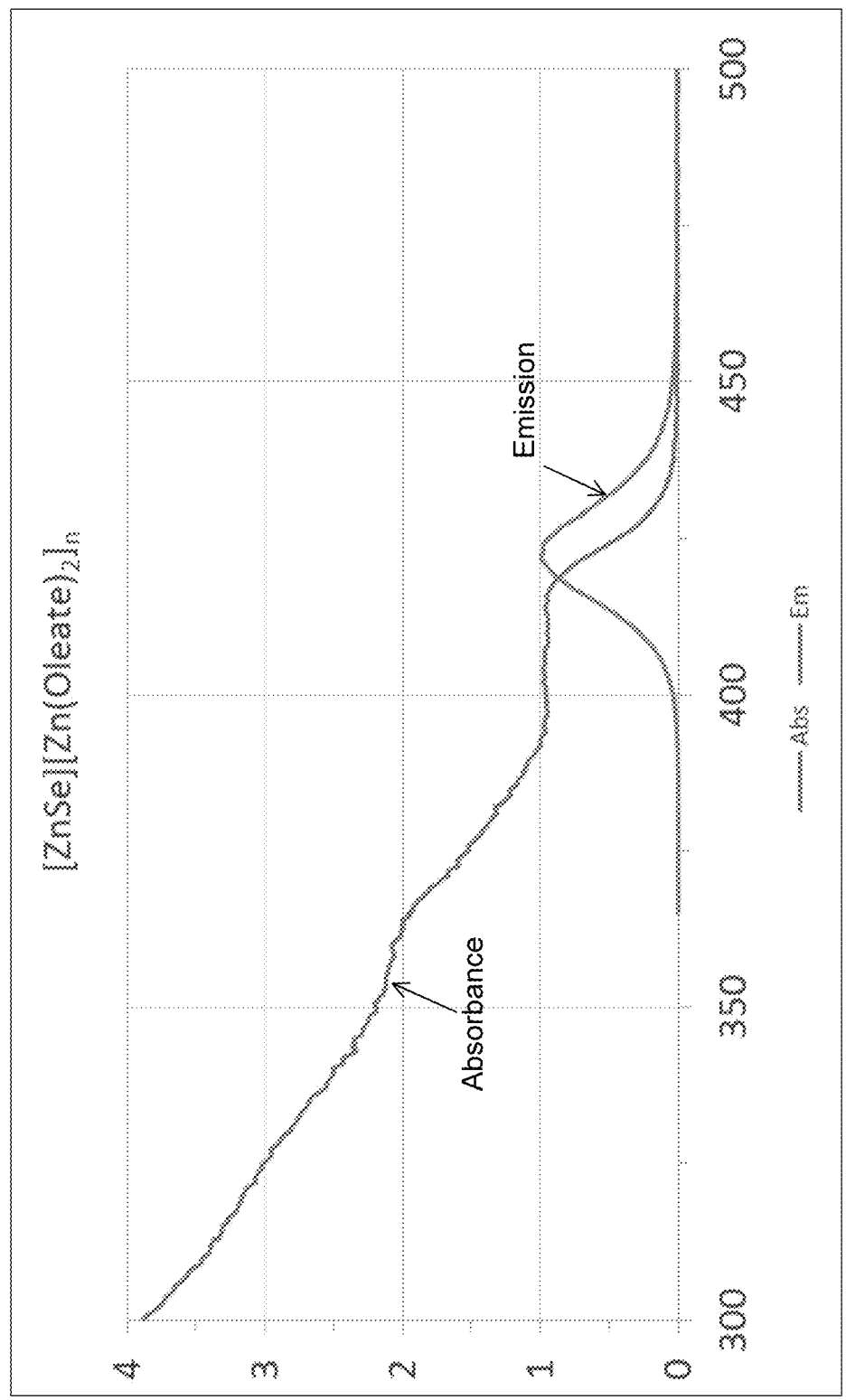
FIG. 9 shows UV-vis absorbance and photoluminescence emission spectra of isolated ZnSe cores that have been ligand exchanged with $Zn(oleate)_2$, with excitation wavelength at 355 nm.

After holding the mixture at 310° C. for 2 hours, the heating mantle was removed and the mixture was allowed to cool. When the temperature fell below 150° C., 10 mL of toluene, Syringe 3, was added. The mixture was brought into the glovebox and worked-up as described in examples 2 and 3. The spectra of the isolated product are shown in FIG. 9.

Example 5

Ligand Exchange Method 2, Maintaining an Elliptical Shape and Subsequent InP Shell Growth Treatment of ZnSe(oleylamine)$_n$ with an excess of zinc acetate at 150° C. resulted in an increase in the photoluminescence intensity and a more symmetric emission line. This low-temperature treatment induced less redshift (cf. 395→398 nm) than that of Method 1 in example 3. Due to the low reaction temperature, if Zn(oleate)$_2$ is used in place of zinc acetate the reaction becomes very slow and the increase in the photoluminescent intensity occurs at an unreasonably slow pace. Presumably the ability of zinc acetate to facilitate ligand exchange at lower temperatures may be attributed to reduced steric demands which allow it to better access the nanocrystal surface. However, the acetate ligands are unlikely to provide colloidal stability to the nanocrystals. Therefore, the acetate moiety is subsequently exchanged with a palmitic acid under vacuum. The overall result of this process is functionally the same as Method 1 insofar as it prepares the surface of the crystal with zinc carboxylate ligands; however, this method results in only a small red-shift in the absorbance and photoluminescence emission spectra of the ZnSe and does not result in a change in shape of the ZnSe core from elliptical to spherical.

The ZnSe(Zn[palmitate]$_2$)$_m$ and a mixture of InCl$_3$(TBP)$_2$ and P(SiMe$_3$)$_3$ in octadecene were infused at 205° C. causing the photoluminescent signal to both red-shift and reduced in intensity. After allowing some time for InP shell growth, additional zinc salts were added to passivate the surface. By the addition of zinc acetate and heating to 220° C., the nanocrystal photoluminescent intensity was increased. An aliquot taken at this point showed a single population of nanostructures by TEM (FIG. 6B). A larger-band gap shell was grown over the ZnSe/InP nanostructure by the addition of Zn(oleate)$_2$, ZnCl$_2$, TOPSe, and dodecanethiol using standard procedures.

Figure 10:
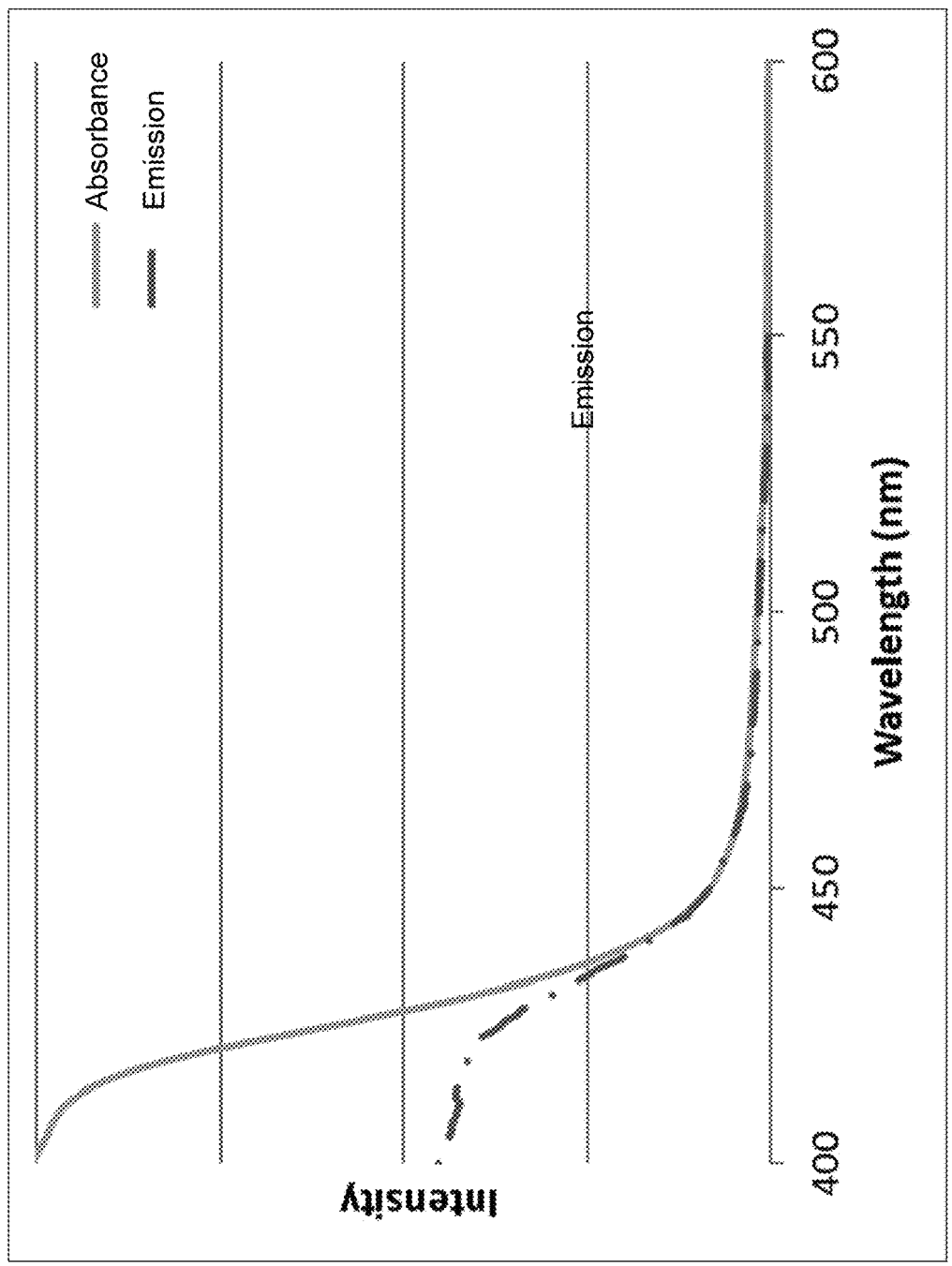
FIG. 10 shows UV-vis absorbance spectrum and photoluminescence excitation scan of ZnSe/InP/ZnSe/ZnS nanostructures showing an overlap of absorbance spectrum and photoluminescence excitation scan monitoring emission at 650 nm.

The ZnSe/InP/ZnSe/ZnS nanostructurs were purified by precipitation with ethanol and redispersion in toluene. The final photoluminescence parameters were $\lambda_{em}$=527 nm, FWHM=98 nm, $\Phi_{PL}$=11.9%. The emission was independent of excitation wavelength and an excitation scan measuring emission at 650 nm followed the shape of the absorbance spectrum (FIG. 10).

As shown in FIGS. 6A and 6B, ZnSe cores that have undergone ligand exchange with zinc carboxylates react differently with InP precursors. After ligand exchange by Method 1, this reaction produces secondary nucleation of InP in the presence ZnSe nanostructures (FIG. 6A). In contrast, after ligand exchange by Method 2 an InP shell is grown over the ZnSe core, producing ZnSe/InP (FIG. 6B).

TABLE 5

ICP data for a ZnSe(oleylamine)n core and ZnSe/InP/ZnSe/ZnS composite nanostructure presented as molar ratios normalized to Se content

|  | Zn | Se | S | In | P |
|---|---|---|---|---|---|
| ZnSe | 1.11 | 1.00 |  |  |  |
| ZnSe/InP/ZnS | 2.65 | 1.00 | 1.36 | 0.19 | 0.26 |

Example 6

Ligand Exchange with Zn(Oleate)$_2$ without Shape Change and Subsequent InP Shell Growth Reagents used for ligand exchange and subsequent shell growth is listed in Table 6.

TABLE 6

Reagents for ligand exchange and subsequent shell growth to form ZnSe/InP/ZnSe/ZnS nanostructures

| ZnSe/InP/ZnSeS | Vol (mL) | mmol |
|---|---|---|
| Round-bottom |  |  |
| Trioctylphosphine oxide |  | 32.33 |
| Zinc Acetate |  | 1.20 |
| 1) ZnSe Core |  |  |
| Sample A |  | 1.01 |
| 2) Ligand Exchange |  |  |
| Palmitic Acid |  | 1.46 |
| 1-octadecene | 40 |  |
| 3) InP Addition |  |  |
| Volume of InP stock solution | 3.55 | 0.31 |
| Rate of addition: 0.144 mL/min | Addition Time: 24.6 min |  |
| 4) Zinc Acetate Treatment |  |  |
| Zinc Acetate | 220 | 1.20 |
| 5) Solid Shell Reagents |  |  |
| Zinc Oleate | 850 | 1.35 |
| Zinc Chloride | 55 | 0.40 |
| 6) ZnSe Buffer Growth |  |  |
| TOPSe | 0.20 | 0.38 |
| 7) ZnS Shell Growth |  |  |
| Dodecanethiol | 0.120 | 0.50 |
| Rate of addition: 0.012 mL/min | Addition Time: 10.0 min |  |

TABLE 7

Composition of InP stock solution

| InP Stock Solution InCl3 Stock | Mass (mg) | Volume (mL) | Conc. (M) | mmol |
|---|---|---|---|---|
| 1M InCl$_3$/TBP |  | 1.00 | 1.00 | 1.00 |
| P(SiMe$_3$)$_3$ neat | 250 |  |  | 1.00 |
| 1-octadecene |  | 10.00 |  | 31.25 |

A degassed mixture of zinc acetate dissolved in trioctylphosphine oxide at 90° C. was added to ZnSe(oleylamine)$_n$ cores with an initial absorbance maximum at 395 nm. This mixture was then heated to 150° C. for 3 h over which time the emission intensity increased, and the absorbance maximum shifted to 399 nm. The heating mantle was removed, allowing the mixture to cool below 100° C. before palmitic acid and octadecene were added to the flask. This mixture was heated to 105° C. under vacuum for 3 h to remove acetic acid displaced by the incoming palmitic acid ligand.

In a separate vessel, 1 M InCl$_3$ in tributylphosphine was combined with P(SiMe$_3$)$_3$ in octadecene at 20° C. The resulting solution immediately turned into a pale-yellow color that darkened as the solution was stored under dynamic vacuum for 1 hour at 20° C. After 1 hour, the headspace was refilled with N$_2$ and the solution was used without purification.

Figure 11:
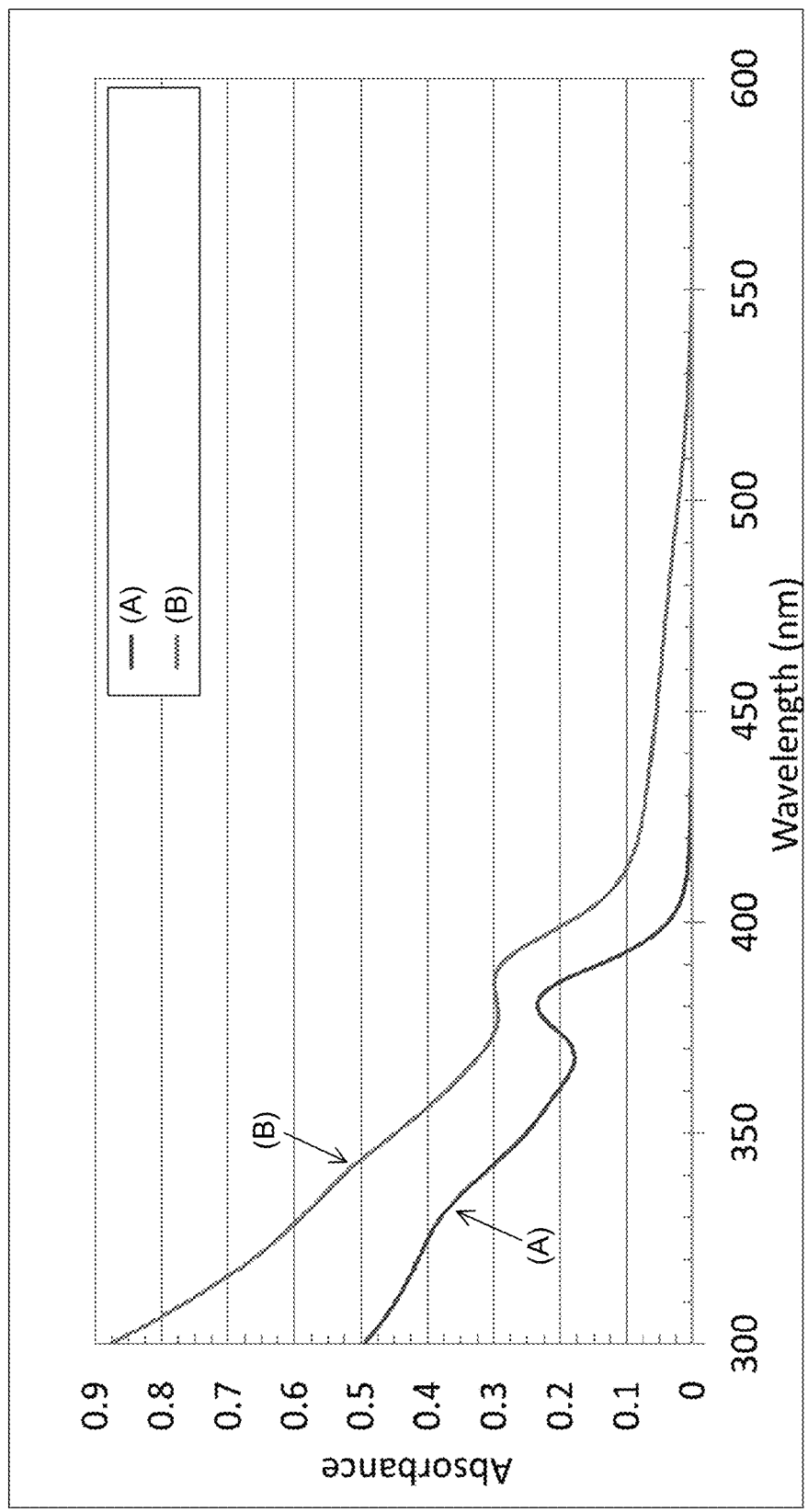
FIG. 11 shows UV-vis absorbance spectra of ZnSe cores after treatment with zinc acetate and palmitic acid (line A), and nanostructures formed by subsequent treatment with InP and zinc acetate (line B). The absorbance feature from 425-550 nm is attributed to an InP shell.

The flask containing the ZnSe cores was returned to an N$_2$ atmosphere and heated to 205° C. At this temperature, the InP stock solution was added over 24.6 min then the reaction was held at this temperature for 5 min. During the addition the emission maximum shifted from 399 nm to 407 nm and the intensity of emission was greatly reduced. The mixture was then cooled to 150° C. and zinc acetate was added. The mixture was heated to 150° C. for 2 h, increasing the emission intensity and further shifting the emission maximum to 493 nm. Finally, the mixture was heated to 220° C. further increasing the emission intensity and shifting the emission maximum to 516 nm. A UV-vis spectrum taken at this stage showed a distinct red-shifted absorption feature (line B as shown in FIG. 11) compared to the ZnSe cores prior to the addition of InP (line A as shown in FIG. 11).

Figure 12:
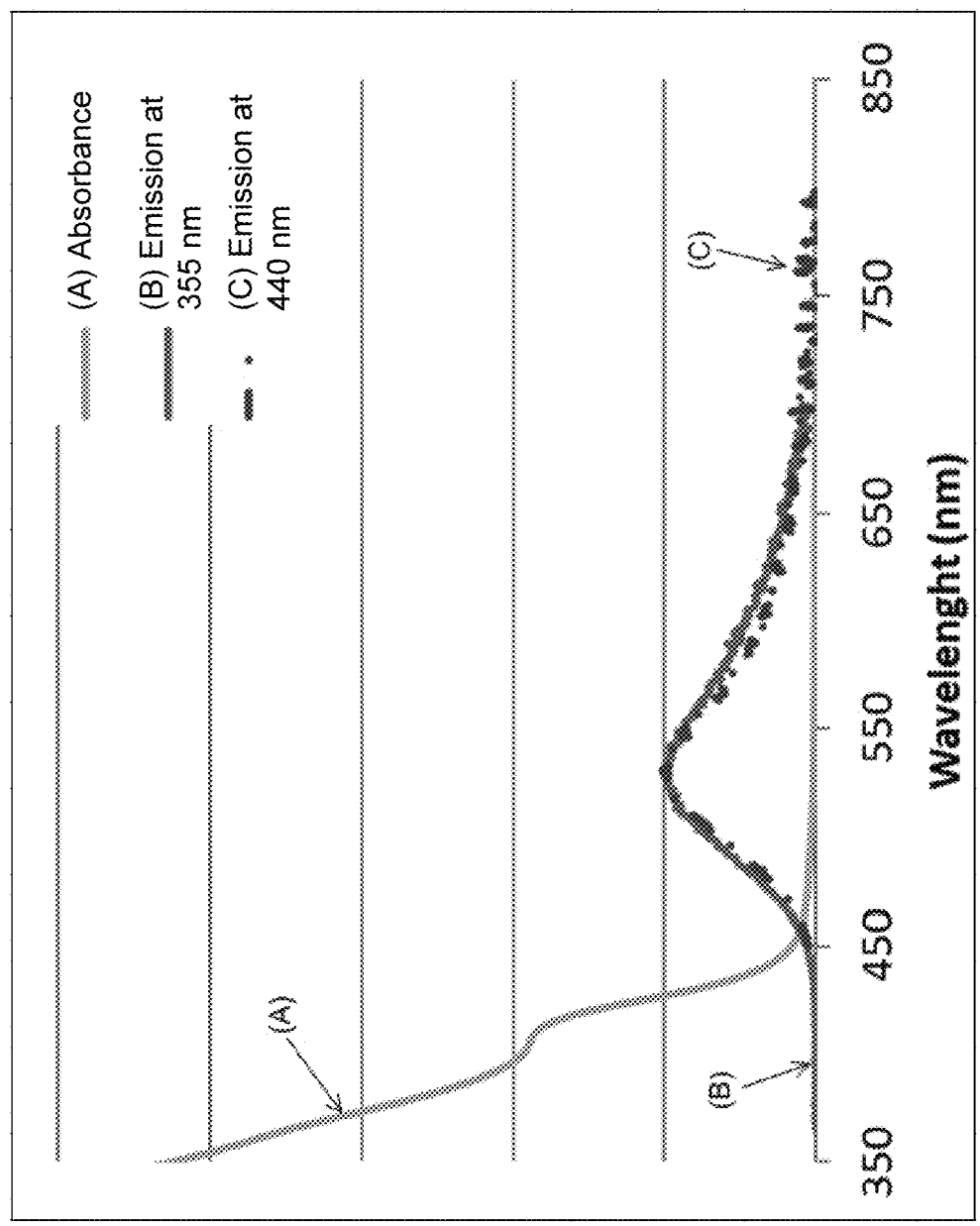
FIG. 12 shows UV-vis absorbance and photoluminescence emission spectra of ZnSe/InP/ZnSe/ZnS nanostructures prepared by shell growth over ZnSe nanostructures that have been ligand exchanged using a zinc carboxylate ligand.

The mixture was cooled below 100° C. before Zn(oleate)$_2$ and ZnCl$_2$ were added as solids. The mixture was melted at 105° C. before it was heated to 220° C. At this temperature TOPSe was added dropwise to the mixture and the temperature was held for 10 min. Then, the temperature was increased to 310° C. and dodecanethiol was added at a rate of 0.012 mL/min over 10 min. The reaction mixture was held at this temperature for 1 hour. The reaction was cooled. The reaction product was precipitated with an excess of ethanol and then dissolved in a minimum amount of toluene. The UV-vis and photoluminescence emission spectra of ZnSe/InP/ZnSe/ZnS nanostructures are shown in FIG. 12.

Figure 13:
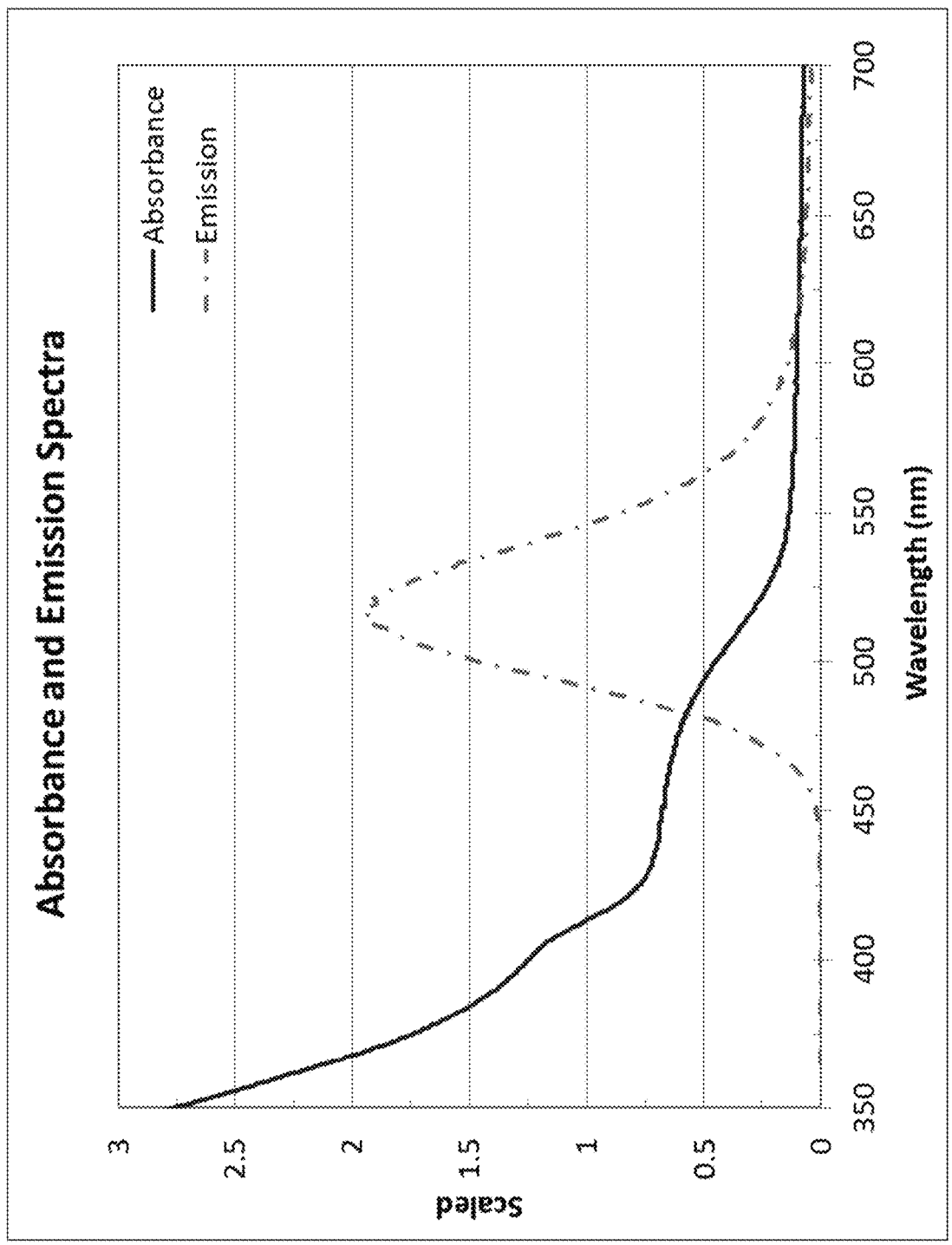
FIG. 13 shows UV-vis absorbance and photoluminescence emission spectra of ZnSe/InP/ZnS nanostructures.

ZnSe/InP was washed prior to further shelling of ZnS. FIG. 13 shows an absorbance and photoluminescence emission spectra of ZnSe/InP/ZnS nanostructure.

Figure 14A:
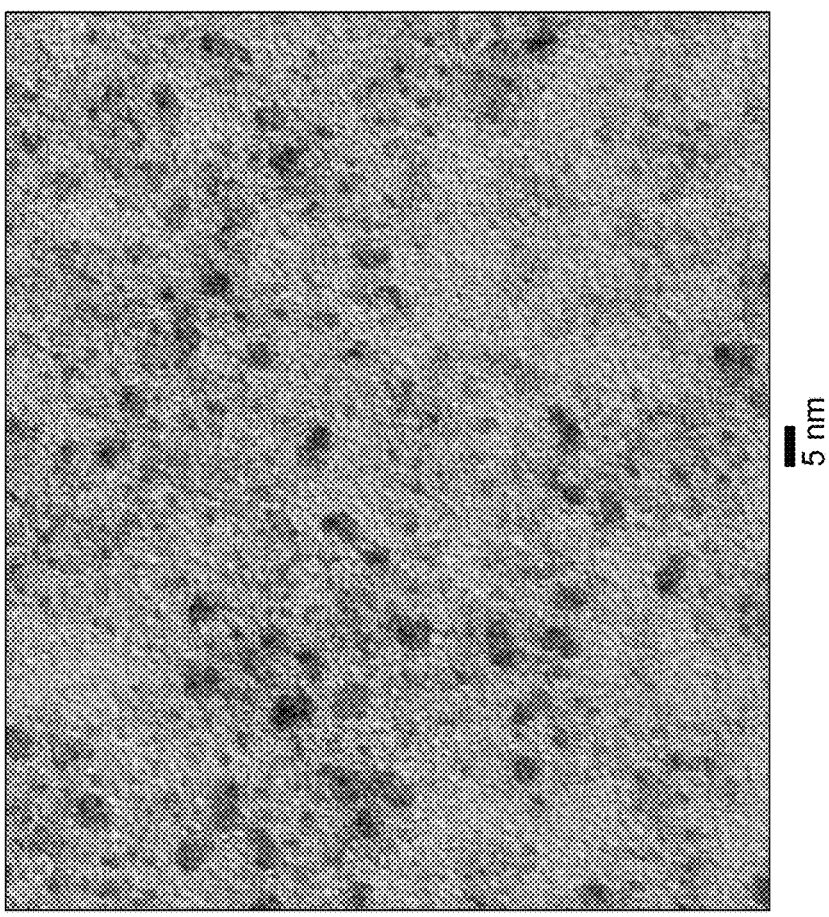
FIGS. 14A, 14B, and 14C show three TEM images of nanostructure shape changes during a nanostructure synthesis: ZnSe (FIG. 14A), ZnSe/InP (FIG. 14B), and ZnSe/InP/ZnS (FIG. 14C).
Figure 14B:
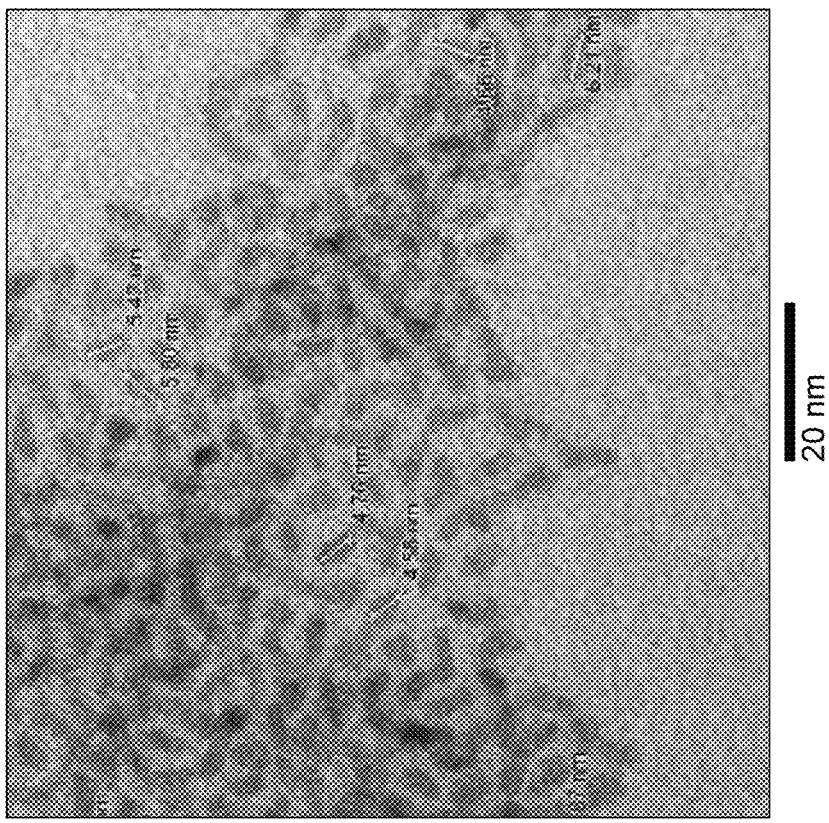
Figure 14C:
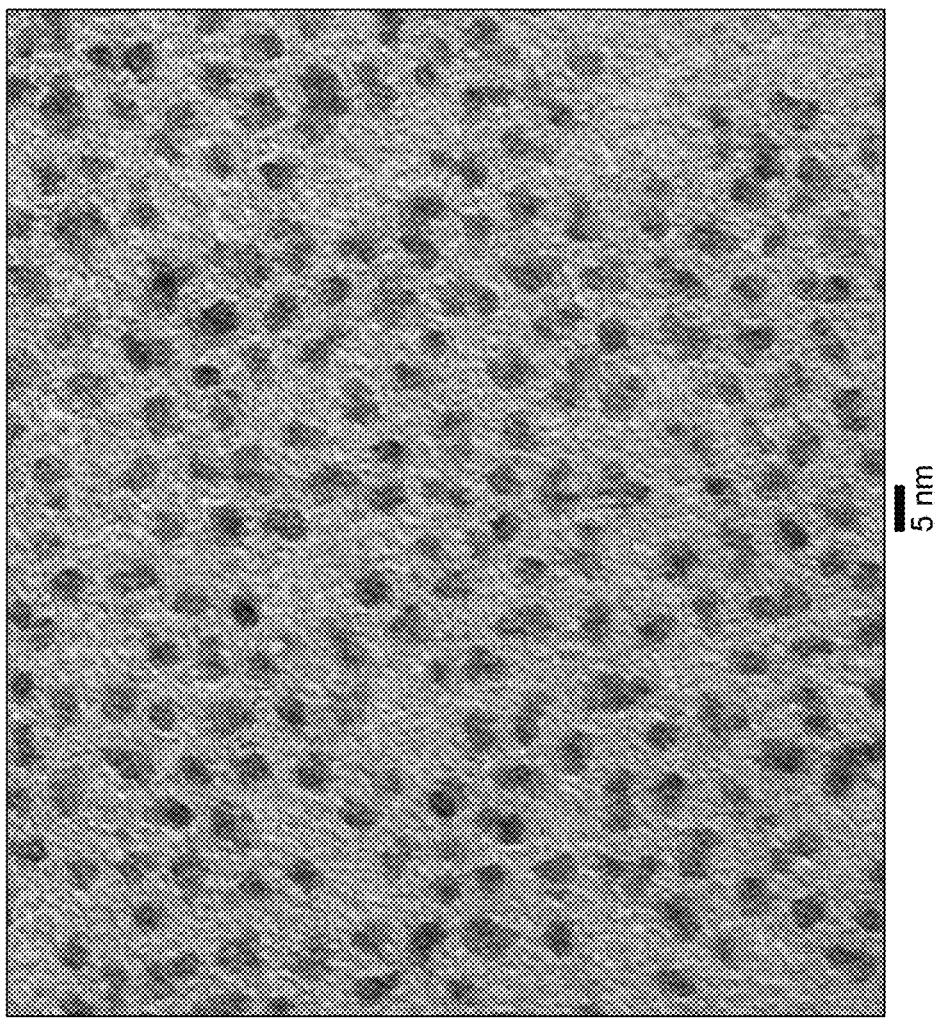

Excitation scan shows the same shape as UV-vis absorbance. No photoluminescence features were attributable to ZnSe nanostructures, indicating that InP shell was grown over and covered the ZnSe core. As shown in FIGS. 14A, 14B, and 14C, TEM images indicate that initial ZnSe nanostructure had a larger aspect ratio than the final nanostructures, explaining the apparent decrease in size (as determined by the longest cross-section). Sizes of synthesized ZnSe/InP/ZnS and ZnSe/InP/ZnSeS nanostructures are shown in Table 8. ICP-OES of synthesized ZnSe/InP, ZnSe/InP/ZnSeS and ZnSe/InP/ZnS nanostructures are shown in Table 9. And e-beam diffraction of synthesized InP, ZnSe, ZnSe/InP, ZnSe/InP/ZnSeS and ZnSe/InP/ZnS nanostructures are shown in Table 10, indicating that the diffraction is consistent with an averaging of ZnSe and InP indices.

TABLE 8

Sizes of synthesized ZnSe/InP/ZnS and ZnSe/InP/ZnSeS nanostructures

| Synthesis | ZnSe (nm) | ZnSe/InP (nm) | ZnSe/InP/shell (nm) |
|---|---|---|---|
| ZnSe/InP/ZnS | 5.05 ± 0.57 | 4.12 ± 0.57 | 4.00 ± 0.82 |
| ZnSe/InP/ZnSeS |  | 3.57 ± 0.61 | 4.90 ± 1.03 |

TABLE 9

ICP-OES of synthesized ZnSe/InP, ZnSe/InP/ZnSeS and ZnSe/InP/ZnS nanostructures

| | Normalized Mole Fraction | | | | |
|---|---|---|---|---|---|
| Material | Se | Zn | S | P | In |
| ZnSe/InP | 1.00 | 1.57 | −0.05 | 1.36 | 1.20 |
| ZnSe/InP/ZnSeS | 1.00 | 1.97 | 0.92 | 0.24 | 0.20 |
| ZnSe/InP/ZnS | 1.00 | 6.12 | 3.53 | 1.11 | 0.84 |

TABLE 10

E-beam diffraction of synthesized InP, ZnSe, ZnSe/InP, ZnSe/InP/ZnSeS and ZnSe/InP/ZnS nanostructures

| InP Cubic | ZnSe Cubic | ZnSe/InP/ZnSeS | ZnSe/InP/ZnS |
|---|---|---|---|
| 3.390 | 3.280 | 3.322 | 3.200 |
| 2.800 | 2.000 | 2.023 | 1.946 |
| 1.771 | 1.700 | 1.742 | 1.675 |

Example 7

Synthesis of Nanostructures Having the Composition of Either ZnSe/InP/ZnSe/ZnS or ZnSe/InP/ZnS Reagents used for synthesis of nanocrystal in samples A-D are listed in Table 11.

TABLE 11

Synthesis of nanostructures in samples A-D

| Reagent | Sample A (mmol) | Sample B (mmol) | Sample C (mmol) | Sample D (mmol) |
|---|---|---|---|---|
| ZnSe Core Preparation Reaction | | | | |
| OP(oct)$_3$ | 12.93 | 12.93 | 38.80 | 38.80 |
| zinc acetate | 1.20 | 1.20 | 9.99 | 9.99 |
| ZnSe nanocrystals Abs = 396 nm | 0.82 | 0.82 | 6.80 | 6.80 |
| Ligand Exchange and Acetic Acid Displacement | | | | |
| palmitic acid | 1.56 | 1.56 | 12.87 | 12.87 |
| 1-octadecene | 125.00 | 125.00 | 312.49 | 312.49 |
| InP Shell Growth Reaction | | | | |
| InCl$_3$ in P(Bu)$_3$ | 0.018 | 0.018 | 0.31 | 0.72 |
| P(SiMe$_3$)$_3$ | 0.018 | 0.018 | 0.31 | 0.72 |
| 1-octadecene | 0.55 | 0.55 | 3.18 | N/A |
| dibenzyl ether | N/A | N/A | 1.18 | 12.5 |
| zinc acetate | 1.64 | 1.64 | | |
| ZnS Shell Growth Reaction | | | | |
| zinc oleate | 4.77 | 4.77 | 39.79 | 39.79 |
| palmitic acid | 1.17 | 1.17 | 9.75 | 9.75 |
| 1-octadecene | 24.9 | 24.9 | 115.20 | 115.20 |
| SeP(oct)$_3$ | 0.29 | N/A | N/A | N/A |
| dodecanethiol | 1.25 | 1.25 | 10.44 | 10.44 |

Procedures:

Sample A: reagents were loaded into round-bottom flask and degassed at ambient before ZnSe nanocrystals were introduced. The mixture was heated to 125° C. for 3 hours. Then, octadecene and palmitic acid were added and the mixture was refluxed at 105° C. for 2 hours under dynamic vacuum to remove acetic acid as it evolved. Simultaneously, a mixture of P(SiMe$_3$)$_3$, ODE, InCl$_3$/PBu$_3$ in octadecene was stored under dynamic vacuum for 2 hours to remove chlorotrimethylsilane.

Under positive N$_2$ pressure, the InP precursor solution was infused into the ZnSe nanocrystal solution at 125° C. at the rate of 0.325 mL/min. The solution was stirred for an additional 2 hours. Then zinc acetate was added and the mixture heated to 220 C for 20 min. The mixture was cooled and the nanocrystal precipitated by a non-solvent to remove excess reagents. The solid precipitate was dissolved in octadecene and immediately used in the next step.

The octadecene solution of nanocrystals was added to the mixture of zinc oleate and palmitic acid at 250° C. Immediately, the thiol was added 5 min before heating the mixture to 310° C. for 40 min to grow a ZnS shell. The reaction mixture was cooled, diluted with toluene. And the nanocrystals were isolated by precipitation with non-solvent and then dissolved in toluene.

Sample B: reagents were loaded into round-bottom flask and degassed at ambient before ZnSe nanocrystals were introduced. The mixture was heated to 125° C. for 3 hours. Then, octadecene and palmitic acid were added and the mixture was refluxed at 105° C. for 2 hours under dynamic vacuum to remove acetic acid as it evolved. Simultaneously, a mixture of P(SiMe$_3$)$_3$, ODE, InCl$_3$/PBu$_3$ in octadecene was stored under dynamic vacuum for 2 hours to remove chlorotrimethylsilane.

Under positive N$_2$ pressure, the InP precursor solution was infused into the ZnSe nanocrystal solution at 125° C. at a rate of 0.325 mL/min. The solution was stirred for an additional 2 hours. Then zinc acetate was added and the mixture heated to 220° C. for 20 min. The mixture was cooled. And the nanocrystals were precipitated by a non-solvent to remove excess reagents. The solid precipitate was dissolved in octadecene and immediately used in the next step.

The octadecene solution of nanocrystals was added to the mixture of zinc oleate and palmitic acid at 250° C. Immediately, TOPSe was injected quickly before the thiol was added. After 5 min, the mixture was heated to 310° C. and the temperature maintained for 40 min to grow a ZnS shell. The reaction mixture was cooled, diluted with toluene. And the nanocrystals were isolated by precipitation with non-solvent then dissolved in toluene.

Sample C: reagents were loaded into round-bottom flask and degassed at ambient before ZnSe nanocrystals were introduced. The mixture was heated to 125° C. for 3 hours. Then, octadecene and palmitic acid was added and the mixture was refluxed at 105° C. for 2 hours under dynamic vacuum to remove acetic acid as it evolved. Simultaneously, a mixture of P(SiMe$_3$)$_3$, ODE, InCl$_3$/PBu$_3$ in octadecene was stored under dynamic vacuum for 2 hours to remove chlorotrimethylsilane.

Under positive N$_2$ pressure, the InP precursor solution was infused into the ZnSe nanocrystal solution at 200° C. at a rate of 0.77 mL/min. Then the zinc acetate was added as a solid. The solution was then heated to 220° C. for an additional 5 minutes. The mixture was cooled. And the nanocrystals were precipitated by a non-solvent to remove excess reagents. The solid precipitate was dissolved in octadecene and immediately used in the next step.

The octadecene solution of nanocrystals was added to the mixture of zinc oleate and palmitic acid at 250° C. Immediately, the thiol was added 5 min before heating the mixture to 310° C. and the temperature maintained for 40 min to grow a ZnS shell. The reaction mixture was cooled, diluted with toluene. And the nanocrystals were isolated by precipitation with non-solvent then dissolved in toluene.

Sample D: reagents were loaded into round-bottom flask and degassed at ambient before ZnSe nanocrystals were introduced. Mixture was heated to 125° C. for 3 hours. Then, octadecene and palmitic acid was added and the mixture was refluxed at 105° C. for 2 hours under dynamic vacuum to remove acetic acid as it evolved. Simultaneously, a mixture of $P(SiMe_3)_3$, ODE, $InCl_3/PBu_3$ in octadecene was stored under dynamic vacuum for 2 hours to remove chlorotrimethylsilane.

Under positive $N_2$ pressure, 6 mL of the InP precursor solution was infused into the ZnSe nanocrystal solution at 190° C. at 0.6 mL/min. Then the zinc acetate was added as a solid. An additional 6 mL of the InP precursor solution was infused at a fixed rate, then an additional three 1 mL portions as a method to control the final emission wavelength of the nanocrystal. When the emission wavelength measured reached about 515 nm, the mixture was cooled. The nanocrystals were precipitated by a non-solvent to remove excess reagents. The solid precipitate was dissolved in octadecene and immediately used in the next step.

The octadecene solution of nanocrystals was added to the mixture of zinc oleate and palmitic acid at 250° C. Immediately, the thiol was added over 5 min before heating the mixture to 310° C. The temperature was maintained for 40 min to grow a ZnS shell. The reaction mixture was cooled, diluted with toluene. And the nanocrystals were isolated by precipitation with non-solvent then dissolved in toluene.

Example 8

Spectral Characterization (Increased Blue Absorbance in 6 mm Films)

Toluene solutions of nanostructures were treated with a short-chained methoxy polyethylene glycol carboxylic acid (EO2CA) and phase-transferred into propylene glycol methyl ether acetate (PGMEA). These solutions were corrected to a constant dry mass (inorganic mass later determined by thermogravimetric analysis) and formulated into a photoresist film which had 41.7% dry nanostructure mass prior to cure. For each nanostructure, three films were prepared, and the data interpolated to that for a 6 μm film (Table 12).

The films prepared in this method showed a 30% decrease in blue light transmittance for reverse type 1 nanostructures as compared to a type 1 nanostructure emitting at the same wavelength in film. Furthermore, when the absorbance at 450 nm was measured, the reverse type 1 nanostructures had 30% higher absorbance on an inorganic mass (nanocrystal only, excluding ligand basis). This example shows that, for films emitting at the same wavelength, there is a decrease in blue light leakage for the reversed type 1 structure, a desirable characteristic for a QDCC.

TABLE 12

Blue transmission data for 6 μm QDCC films formulated to 41.7% nanostructure by dry mass. *

| Composition | Solution $\lambda_{em}$ (nm) | $\lambda_{em}$ (nm) | Blue Trans (%) | Film $OD_{450}$ | Film Inorg Mass Loading (%)[†] | Film $OD_{450}$/ Inorg Mass[†] |
|---|---|---|---|---|---|---|
| InP/ZnSe/ZnS[‡] | 529 | 539 | 19.4 | 0.71 | 13.0 | 5.5 |
| ZnSe/InP/ZnS | 523 | 539 | 14.0 | 0.86 | 11.9 | 7.2 |
| ZnSe/InP/ZnS | 534 | 549 | 13.5 | 0.88 | 12.6 | 7.0 |

* Low blue transmittance and high OD450 are desirable properties for a QDCC.

[†]Calculated using inorganic mass of nanostructures in film. Does not include other species such as scattering media.

[‡]regular type 1 nanostructures

Example 9

Nanostructure Properties Characterization

Figure 15B:
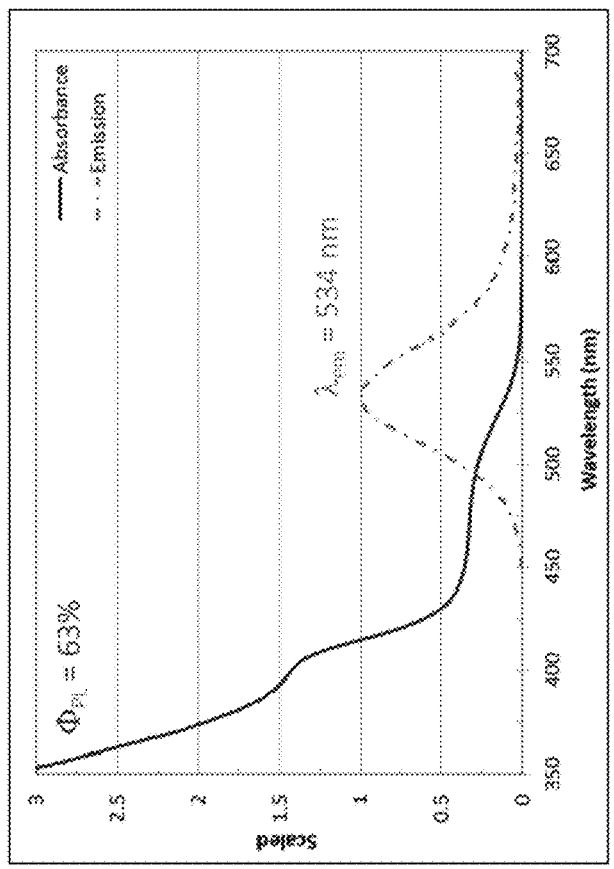
FIGS. 15A and 15B show UV-vis absorbance and photoluminescent emission spectra of ZnSe/InP/ZnS nanostructures in hexane, with an emission peak at 523 nm (FIG. 15A) and 534 nm (FIG. 15B).
Figure 15A:
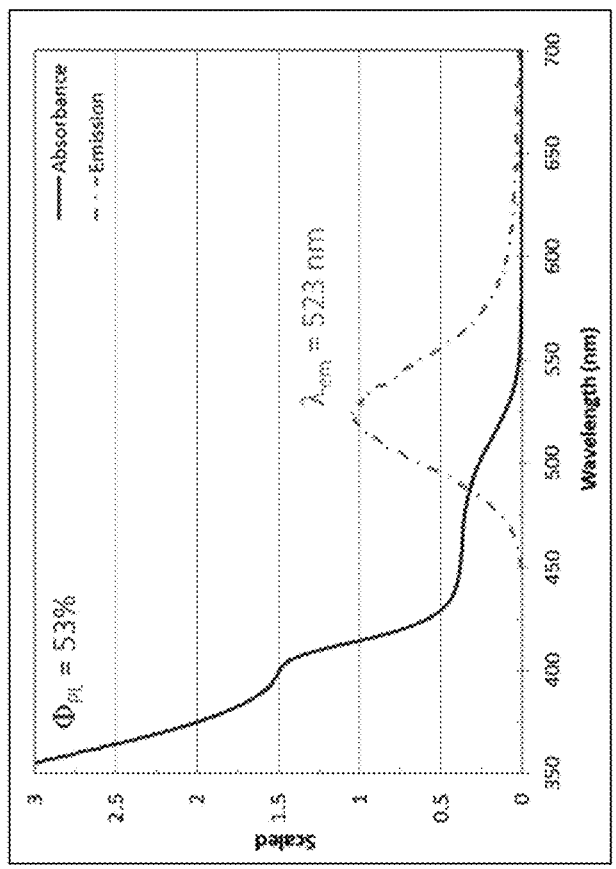

In solution, reverse type 1 nanostructures showed emission that were tunable from 480 nm to 650 nm. A selection of nanostructures suitable for the use in green QDCC films are shown in Table 13 and FIGS. 15A and 15B. From an emission of maximum of 516 nm-534 nm, the emission wavelength was tuned by increasing the thickness of the InP layer alone. The emission wavelength can be further redshifted by the inclusion of selenium in the outermost shell, as shown in one example of ZnSe/InP/ZnSeS that has the same amount of InP with $\lambda_{em}$=516 nm. Optimization of the synthetic method can further decrease the FWHM and increase the photoluminescent quantum yield in solution.

To confirm that the increase in blue light absorbed by the nanostructures was due to changes in the nanostructure composition, ICP-OES data were obtained for reverse type 1 and type 1 nanostructures. These data show that the InP as a percentage of the total inorganic mass is 8% or above for reverse type 1 nanostructures, and uniformly below 8% for type 1 nanostructures. These data support the notion that increased blue light absorbance is due to an increase in the mass fraction of InP per nanostructure.

Examination of the $OD_{450}$/total-mass among the nanostructures (Table 13) shows a small increase for all the reverse type 1 nanostructures with a ZnSe/InP/ZnS structure compared to the type 1 structures. The examples of reverse type 1 nanostructures emitting at 523 nm and 534 nm, used for the film examples, both had $OD_{450}$/total mass values of about 0.3. This is roughly the upper-limit of $OD_{450}$/mass ratios achieved by using a type 1 structure in conjunction with an amine wash. The uppermost $OD_{450}$/total mass measured for a reverse type 1 nanostructure was 0.55 for the 516 nm emitting nanostructure. This value is substantially higher than that of type 1 InP nanostructures. This nanostructure has a higher ratio due to a much thinner ZnS shell (Table 14, ICP results) than other reverse type 1 examples.

TABLE 13

Spectral properties of reverse type 1 nanostructures in hexane.

| Composition | $\lambda_{em}$ (nm) | FWHM (nm) | $\Phi_{PL}$ (%) | $OD_{450}$/ total mass | $OD_{450}$/ inorg mass | InP/ inorg mass from ICP-OES (%) | Sample ID |
|---|---|---|---|---|---|---|---|
| InP/ZnSe/ZnS #1 | 527 | 38.5 | 86.2 | 0.26 | 0.34 | 6.3 | A |
| InP/ZnSe/ZnS #2 | 532 | 39.0 | 90 | 0.27 | 0.36 | 6.4 | B (estimate) |
| InP/ZnSe/ZnS #3 | 525 | 39.0 | 95 | 0.20 | 0.32 | 7.8 | C (estimate) |
| ZnSe/InP/ZnS | 516 | 58.7 | 40.4 | 0.55 | 0.66 | 18.1 | D |
| ZnSe/InP/ZnS | 523 | 59.6 | 53.0 | 0.31 | 0.46 | 8.8 | E |
| ZnSe/InP/ZnS | 534 | 59.1 | 63.1 | 0.29 | 0.61 | 9.0 | F |
| ZnSe/InP/ZnSeS | 528 | 60.0 | 32.5 | 0.28 | 0.73 | 11.4 | G2 |

TABLE 14

Composition and InP mass fraction of various nanostructures.

| Composition | $\lambda_{em}$ (nm) | Normalized Mole Fraction, ICP-OES | | | | | InP/ inorg mass (%) | Internal ID |
|---|---|---|---|---|---|---|---|---|
| | | In | P | Zn | Se | S | | |
| ZnSe/InP | 512 | 1.00 | 1.13 | 1.31 | 0.83 | ND | 49.8 | G1 |
| ZnSe/InP/ZnSeS | 528 | 1.00 | 1.16 | 9.76 | 4.95 | 4.56 | 11.4 | G2 |

Example 10

Structural Confirmation by TEM/Elemental Mapping

Figure 16:
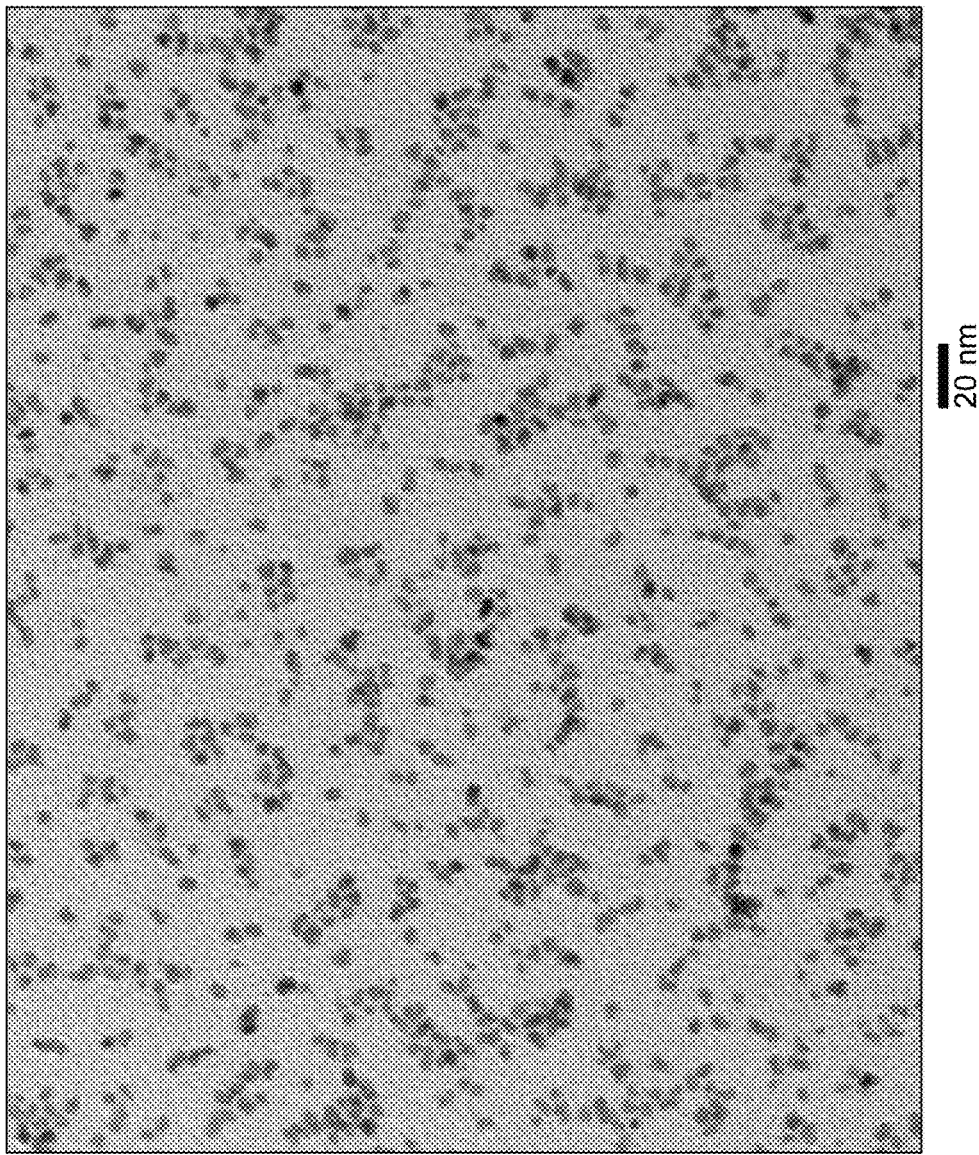
FIG. 16 shows a TEM image of ZnSe/InP/ZnS nanostructures with an emission peak at 534 nm.

The reverse type 1 nanostructures were examined by TEM and electron-beam diffraction. TEMs indicate that the nanostructures are roughly 4-6 nm in diameter and ellipsoidal (FIG. 16). These nanostructures did not exhibit branching. Electron beam diffraction was inconsistent with either pure InP or pure ZnSe, in one instance ($\lambda_{em}$=528 nm) providing diffraction plane distances that are approximately an average of those for the two pure materials (Table 15).

To further provide evidence that the nanostructures have a reverse type 1 arrangement of a ZnSe core overcoated by layers of InP and ZnS shells, an example was examined by TEM/STEM (transmission electron microscopy/scanning transmission electron microscopy) with elemental mapping and EDX (energy-dispersive X-ray diffraction). The resulting images show a highly localized distribution of Se atoms in the putative ZnSe core encapsulated by a more dispersed distribution of Zn atoms (data not shown). The In atoms are localized in the region between Se and S (data not shown) consistent with the proposed construction. Additionally, EDX data shows the presence of all the expected elements for the ZnSe/InP/ZnS nanostructure and background contamination (Cu, O, Al).

TABLE 15

Electron diffraction data for various nanostructures.

| Composition | $\lambda_{em}$ (nm) | Observed Diffraction Planes (Å) | | |
|---|---|---|---|---|
| InP (cubic) | — | 3.390 | 2.800 | 1.771 |
| ZnSe (cubic) | — | 3.280 | 2.000 | 1.700 |
| ZnSe/InP/ZnS | 516 | 3.200 | 1.946 | 1.675 |
|  | 523 | — | — | — |
|  | 534 | — | — | — |
| ZnSe/InP/ZnSeS | 528 | 3.322 | 2.023 | 1.742 |

Example 11

Application in a QDCC

Figure 17:
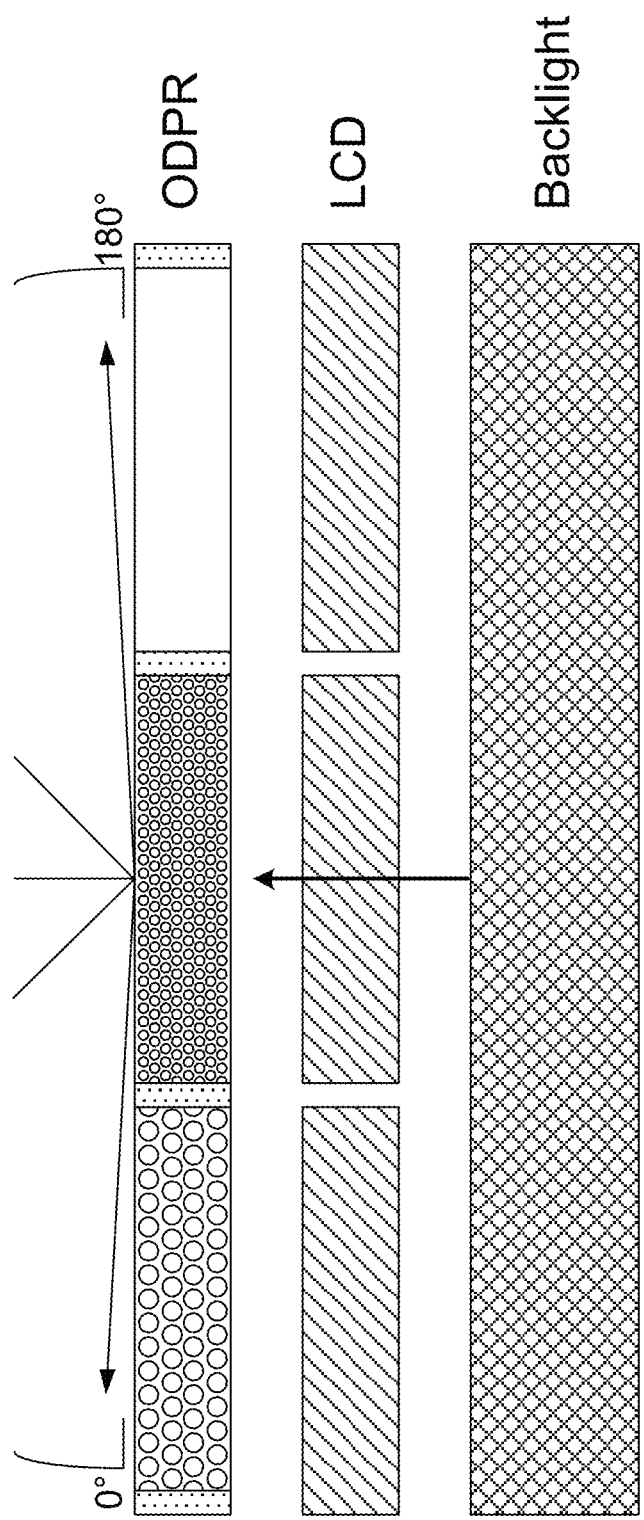
FIG. 17 shows a schematic of a display device with a QDCC component using a blue backlight and an LCD panel.

In a QDCC application, a patterned quantum dot layer (e.g., QDPR as shown in FIG. 17) was positioned near the front of the display panel (e.g., LCD as shown in FIG. 17). Blue light that passes through the backplane is absorbed by the patterned quantum dot layer and either green or red light is emitted (FIG. 17). The backplane can include a blue LED, an LCD, an OLED, a microLED, or any other modular with blue light source. In principle, violet and UV sources could be employed if a blue quantum dot were also used.

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure comprising:
   a core; and
   a first shell disposed on the core, the first shell comprising a first semiconductor material comprising InP; and
   a second shell disposed on the first shell, the second layer comprising a second semiconductor material,
   wherein a band gap energy of the core is greater than a band gap energy of the first shell, and
   wherein an optical density at 450 nm per total mass ($OD_{450}$/total mass) of the nanostructure is between about 0.4 and about 0.9.

2. The nanostructure of claim 1, wherein the core comprises ZnSe.

3. The nanostructure of claim 1, wherein the core has a diameter of about 4 nm.

4. The nanostructure of claim 1, wherein the first shell has a thickness of about 0.5 nm.

5. The nanostructure of claim 1, wherein the second shell has a thickness of about 1 nm.

6. The nanostructure of claim 1, wherein the second shell comprises ZnSe, ZnS, or a combination thereof.

7. The nanostructure of claim 1, wherein the $OD_{450}$/total mass of the nanostructure is about 0.7.

8. The nanostructure of claim 1, wherein a blue transmittance of the nanostructure when present in a film matrix is less than or equal to about 15%, wherein the film matrix has a thickness between about 1 µm and about 25 µm and comprises between about 10% and about 60% of the nanostructure by dry mass, wherein the film matrix has a blue absorbance at 450 nm of less than 1% when not comprising the nanostructure, wherein the blue transmittance is defined as a fraction of an incident light transmitted through the film matrix, and wherein the incident light has a wavelength of about 450 nm.

9. The nanostructure of claim 1, wherein the nanostructure has an emission wavelength of about 530 nm.

10. The nanostructure of claim 1, wherein the nanostructure has a photoluminescence quantum yield between 40% and 60%.

11. A device comprising the nanostructure of claim 1.

12. The device of claim 11, wherein the device is a display device that comprises a quantum dot color converter comprising:
   a back plane;
   a display panel disposed on the back plane; and
   a quantum dot layer comprising the nanostructure, the quantum dot layer disposed on the display panel.

13. The device of claim 12, wherein the display device does not comprise a blue light filter.

14. A method of making a ZnSe core nanostructure with a half width at half maximum (HWHM) of an emitted light of less than or equal to about 10 nm, comprising:
   (a) admixing a solution of a selenium source, a zinc source, and at least one ligand under a first temperature between about 260° C. and about 340° C.;
   (b) adjusting the first temperature of the admixture in (a) to a second temperature between about 260° C. and about 300° C.; and
   (c) infusing a solution comprising the selenium source and the zinc source into the admixture in (b) at an infusing rate between about 0.5 mL/min and about 3 mL/min;
   to provide the core nanostructure.

15. The method of claim 14, wherein the HWHM of an emitted light of the ZnSe core nanostructure is about 9 nm.

16. The method of claim 14, wherein the selenium source is trioctylphosphine selenide, the zinc source is diethylzinc, and the at least one ligand is oleylamine.

17. A method of making a core/shell nanostructure, comprising:
- (a) providing a core comprising a ZnSe nanostructure with a half width at half maximum (HWHM) of an emitted light of less than or equal to about 10 nm, and a first ligand;
- (b) admixing the core with a zinc carboxylate; and
- (c) admixing the admixture in (b) with an indium source and a phosphorus source; and
- (d) admixing the admixture in (c) with a zinc source and a sulfur source.

18. The method of claim 17, wherein the zinc carboxylate is zinc acetate.

19. The method of claim 17, wherein the indium source is indium chloride.

20. The method of claim 17, wherein the zinc source is zinc acetate.

* * * * *